US012805016B2

(12) United States Patent
Lee et al.

(10) Patent No.: US 12,805,016 B2
(45) Date of Patent: Nov. 17, 2026

(54) DISPLAY DEVICE

(71) Applicant: Samsung Display Co., LTD., Yongin-si (KR)

(72) Inventors: Yong Hee Lee, Yongin-si (KR); Jin Seon Kwak, Yongin-si (KR); Kyung Bae Kim, Yongin-si (KR); Ji Hye Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 422 days.

(21) Appl. No.: 18/470,162

(22) Filed: Sep. 19, 2023

(65) Prior Publication Data

US 2024/0120347 A1 Apr. 11, 2024

(30) Foreign Application Priority Data

Oct. 11, 2022 (KR) ........................ 10-2022-0130090
Jun. 23, 2023 (KR) ........................ 10-2023-0081199

(51) Int. Cl.
*H10D 86/60* (2025.01)
*G09G 3/3233* (2016.01)
(Continued)

(52) U.S. Cl.
CPC ........... *H10D 86/60* (2025.01); *G09G 3/3233* (2013.01); *H10D 86/441* (2025.01);
(Continued)

(58) Field of Classification Search
CPC ... H01L 33/486; H01L 33/502; H01L 33/505; H01L 33/507; H01L 33/54; H01L 33/56;
(Continued)

(56) References Cited

U.S. PATENT DOCUMENTS

2018/0011369 A1* 1/2018 An ...................... G02B 5/3083
2019/0221584 A1 7/2019 Kang et al.
(Continued)

OTHER PUBLICATIONS

Dcc.PDF (Kpon foreign search ) (Year: 2026).*
ip.com Search (Year: 2026).*

*Primary Examiner* — Zandra V Smith
*Assistant Examiner* — Andre C Stevenson
(74) *Attorney, Agent, or Firm* — Womble Bond Dickinson (US) LLP

(57) ABSTRACT

A display device includes first and second electrodes, light-emitting elements on the first and second electrodes, data lines extending from a pad area to a display area, connection wirings spaced apart from the data lines and extending from the pad area to a non-display area on respective sides of the display area, first pads overlapping the data lines in the pad area, and second pads overlapping the connection wirings, wherein the connection wirings include a first connection wiring overlapping a second pad, a second connection wiring not overlapping the second pad and overlapping the first connection wiring in the non-display area, and a third connection wiring overlapping the first connection wiring and electrically connected to the second pad, wherein the first and third connection wirings overlap each other in the pad area, and the first, second, and third connection wirings overlap each other in the non-display area.

13 Claims, 22 Drawing Sheets

(51) Int. Cl.
*H10D 86/40* (2025.01)
*H10H 20/857* (2025.01)
*H10W 90/00* (2026.01)

(52) U.S. Cl.
CPC .......... *H10H 20/857* (2025.01); *H10W 90/00* (2026.01); *G09G 2300/0426* (2013.01); *G09G 2310/08* (2013.01)

(58) Field of Classification Search
CPC ....... H01L 2933/0041; H01L 2933/005; G02F 1/1335; B32B 2457/206
See application file for complete search history.

(56) References Cited

U.S. PATENT DOCUMENTS

| | | | | |
|---|---|---|---|---|
| 2019/0341441 | A1* | 11/2019 | Lee | H10K 59/131 |
| 2020/0395419 | A1 | 12/2020 | Kim et al. | |
| 2021/0111234 | A1 | 4/2021 | Kwon et al. | |
| 2021/0313498 | A1* | 10/2021 | Kim | H10H 20/857 |
| 2022/0037299 | A1 | 2/2022 | Lee et al. | |
| 2023/0189583 | A1 | 6/2023 | Lee et al. | |

* cited by examiner

EDA : EDA1, EDA2, EDA3, EDA4

MTL1 : VL, VDL, VVSL
ACTL : DE, ACT, SE
MTL2 : GE
MTL3 : CE, ANE1, HVDL, VSL
MTL4 : RME1, RME2
MTL5 : CTE1, CTE2, CTE4, CTE5

DISPLAY DEVICE

CROSS-REFERENCED TO RELATED APPLICATION

This application claims priority to, and the benefit of, Korean Patent Application No. 10-2022-0130090 filed on Oct. 11, 2022, and Korean Patent Application No. 10-2023-0081199 filed on Jun. 23, 2023, in the Korean Intellectual Property Office, the contents of which in its entirety are herein incorporated by reference.

BACKGROUND

1. Field

The disclosure relates to a display device.

2. Description of the Related Art

Display devices are becoming increasingly important with the development of multimedia. Accordingly, various types of display devices, such as organic light-emitting displays (OLEDs) and liquid crystal displays (LCDs), are being used.

As a device for displaying an image of a display device, there is a self-luminous display device including a light-emitting element. The self-luminous display device may be an organic light-emitting display using an organic material as a light-emitting material as a light-emitting element, or an inorganic light-emitting display using an inorganic material as a light-emitting material.

SUMMARY

Aspects of the disclosure provide a display device in which a step difference of a pad electrode is reduced in a pad area where a plurality of layers are stacked.

However, aspects of the disclosure are not restricted to the one set forth herein. The above and other aspects of the disclosure will become more apparent to one of ordinary skill in the art to which the disclosure pertains by referencing the detailed description of the disclosure given below.

According to one or more embodiments of the disclosure, a display device includes a display area in which pixels are located, a non-display area surrounding the display area in plan view, and a pad area in the non-display area on a side of the display area in a first direction, a first electrode and a second electrode extending in the first direction in the display area, and spaced apart from each other in a second direction crossing the first direction, light-emitting elements on the first electrode and the second electrode in the display area, data lines extending from the pad area to the display area in the first direction, connection wirings spaced apart from the data lines, and extending from the pad area to the non-display area on respective sides of the display area in the second direction, first pads overlapping the data lines in the pad area, and second pads spaced apart from the first pads in the second direction in the pad area, and overlapping the connection wirings, wherein the connection wirings include a first connection wiring overlapping a second pad, and extending in the first direction, a second connection wiring not overlapping the second pad, and overlapping the first connection wiring in the non-display area, and a third connection wiring overlapping the first connection wiring, and electrically connected to the second pad, wherein the first connection wiring and the third connection wiring overlap each other in the pad area, and wherein the first connection wiring, the second connection wiring, and the third connection wiring overlap each other in the non-display area.

The first pads and the second pads may respectively include a pad base layer, and a pad upper layer on the pad base layer and contacting the pad base layer through a pad contact hole, wherein the pad base layer directly contacts a data line of the data lines or the first connection wiring through a first contact hole and a second contact hole that are spaced apart from the pad contact hole in the first direction.

The data line may overlap the first contact hole, the pad contact hole, and the second contact hole overlapping a first pad of the first pads in the pad area.

The first connection wiring may overlap the first contact hole, the pad contact hole, and the second contact hole overlapping a second pad of the second pads in the pad area.

The third connection wiring may be directly connected to the pad upper layer of the second pad in the pad area, and may directly contact the second connection wiring through a third contact hole in a portion overlapping the first connection wiring and the second connection wiring in the non-display area.

The first pads and the second pads may respectively include a first portion overlapping the pad contact hole, a second portion overlapping the first contact hole or the second contact hole, and a third portion between the first portion and the second portion, wherein the first portion, the second portion and the third portion have different respective widths measured in the second direction.

The width of the first portion may be greater than the widths of the second portion and the third portion, wherein the width of the third portion is greater than the width of the second portion.

The data line, the pad base layer and the pad upper layer may have different widths measured in the second direction, wherein differences between the widths of the data line, the pad base layer, and the pad upper layer are constant in each of the first portion, the second portion, and the third portion.

A width of the data line measured in the second direction may be greater than a width of one of the first pads measured in the second direction.

A width of the pad base layer measured in the second direction may be less than a width of the pad upper layer measured in the second direction.

A distance between adjacent ones of the data lines in the pad area may be less than a distance between adjacent ones of the first pads.

The display device may further include scan lines between the data lines, and extending from the pad area to the display area, and third pads overlapping the scan lines in the pad area, wherein the third pads and the first pads are not side by side in the second direction.

A distance between adjacent ones of the first pads in the second direction may be greater than a distance between the data lines and the scan lines.

According to one or more embodiments of the disclosure, a display device includes a substrate including a display area, a non-display area around the display area, and a pad area in the non-display area on a side of the display area, a first metal layer on the substrate, and including a data line in the display area and the pad area, and a first connection wiring in the non-display area and the pad area, a buffer layer on the first metal layer, a second metal layer on the buffer layer, and including a second connection wiring partially overlapping the first connection wiring in the non-display area, an interlayer insulating layer on the second metal layer, a third metal layer on the interlayer insulating layer, and including a third connection wiring overlapping the first connection wiring and the second connection wiring, a pad base layer of a first pad overlapping the data line in the pad area, and a pad base layer of a second pad overlapping the first connection wiring in the pad area, a passivation layer on the third metal layer, an insulating layer on the passivation layer, a pad upper layer of the first pad on the insulating layer, and overlapping the pad base layer of the first pad, and a pad upper layer of the second pad overlapping the pad base layer of the second pad, wherein the first connection wiring and the third connection wiring overlap each other in the pad area, and wherein the first connection wiring, the second connection wiring, and the third connection wiring overlap each other in the non-display area.

The pad upper layer of the first pad may directly contact the pad base layer of the first pad through a pad contact hole penetrating the passivation layer and the insulating layer, wherein the pad upper layer of the second pad directly contacts the pad base layer of the second pad through a pad contact hole penetrating the passivation layer and the insulating layer.

The pad base layer of the first pad may contact the data line through a first contact hole and a second contact hole penetrating the buffer layer and the interlayer insulating layer, wherein the data line overlaps the first contact hole, the pad contact hole, and the second contact hole.

The third connection wiring may contact the second connection wiring through a third contact hole penetrating the interlayer insulating layer in the non-display area, and is directly connected to the pad upper layer of the second pad in the pad area.

The pad base layer of the first pad may have a smaller width than the pad upper layer of the first pad, wherein the pad upper layer of the first pad has a smaller width than the data line.

The display device may further include a via layer on the passivation layer in the display area, wherein the insulating layer is on the via layer in the display area.

The display device may further include a first electrode and a second electrode on the via layer in the display area, a light-emitting element on the first electrode and the second electrode, a first contact electrode on the first electrode and the insulating layer, and a second contact electrode on the second electrode and the first contact electrode, wherein the first contact electrode and the second contact electrode are on a same layer as the pad upper layer of the first pad and the pad upper layer of the second pad, respectively.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
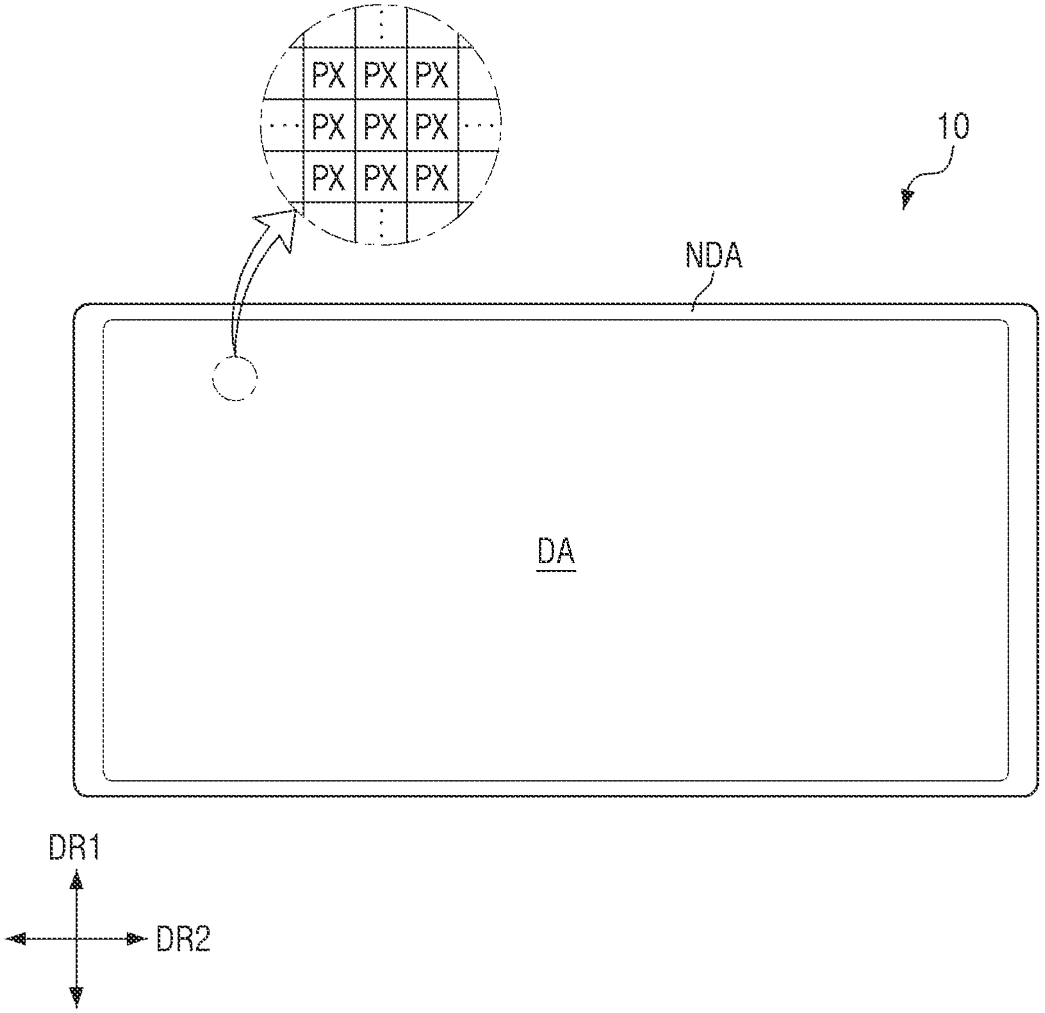
FIG. 1 is a plan view of a display device according to one or more embodiments.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The present disclosure covers all modifications, equivalents, and replacements within the idea and technical scope of the present disclosure. Further, each of the features of the various embodiments of the present disclosure may be combined or combined with each other, in part or in whole, and technically various interlocking and driving are possible. Each embodiment may be implemented independently of each other or may be implemented together in an association.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view of a display device 10 according to one or more embodiments.

Referring to FIG. 1, the display device 10 displays moving images or still images. The display device 10 may refer to any electronic device that provides a display screen. Examples of the display device 10 may include televisions, notebook computers, monitors, billboards, Internet of things (IoT) devices, mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 includes a display panel that provides a display screen. Examples of the display panel may include inorganic light-emitting diode display panels, organic light-emitting display panels, quantum dot light-emitting display panels, plasma display panels, and field emission display panels. A case where an inorganic light-emitting diode display panel is applied as an example of the display panel will be described below, but the disclosure is not limited to this case, and other display panels can also be applied as long as the same technical spirit is applicable.

The shape of the display device 10 can be variously modified. The display device 10 may have various shapes, such as a horizontally long rectangle, a vertically long rectangle, a square, a quadrilateral with rounded corners (vertices), other polygons, or a circle. The shape of a display area DA of the display device 10 may also be similar to the overall shape of the display device 10. In FIG. 1, the display device 10 is shaped like a rectangle that extends lengthwise in a second direction DR2.

The display device 10 may include the display area DA and a non-display area NDA. The display area DA is an area where a screen can be displayed, and the non-display area NDA is an area where no screen is displayed. The display area DA may also be referred to as an active area, and the non-display area NDA may also be referred to as an inactive area. The display area DA may generally occupy the center of the display device 10.

The display area DA may include a plurality of pixels PX. The pixels PX may be arranged in a matrix direction. Each of the pixels PX may be rectangular or square in plan view. However, the disclosure is not limited thereto, and each of the pixels PX may also have a rhombus shape having each side inclined with respect to a direction. The pixels PX may be arranged in a stripe type or an island type. In addition, each of the pixels PX may include one or more light-emitting elements which emit light of a corresponding wavelength band to display a corresponding color.

The non-display area NDA may be located around the display area DA. The non-display area NDA may entirely or partially surround the display area DA (e.g., in plan view). The display area DA may be rectangular, and the non-display area NDA may be located adjacent to four sides of the display area DA. The non-display area NDA may form a bezel of the display device 10. Wirings or circuit drivers included in the display device 10 may be located in, or external devices may be mounted in, the non-display area NDA.

Figure 2:
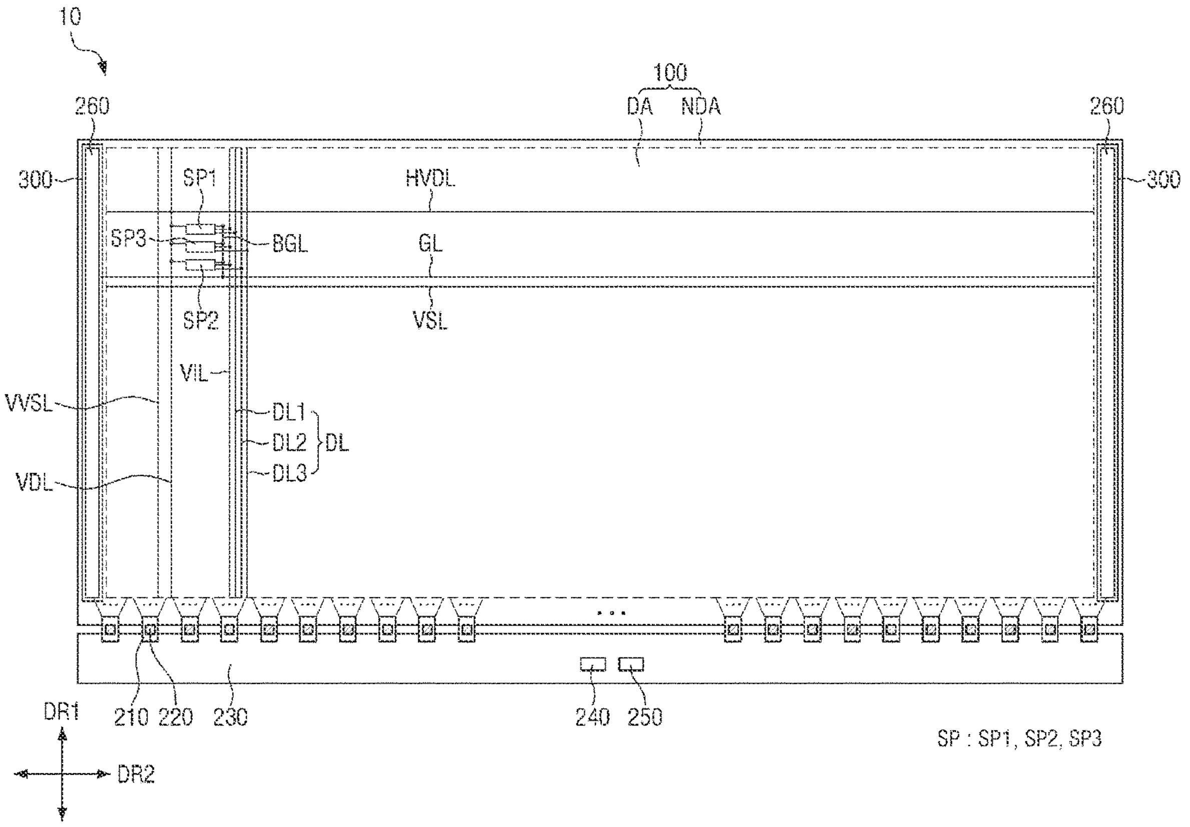
FIG. 2 is a plan view illustrating the arrangement of a plurality of wirings in the display device of FIG. 1.

FIG. 2 is a plan view illustrating the arrangement of a plurality of wirings in the display device 10 of FIG. 1.

Referring to FIG. 2, the display device 10 may include a display panel 100, flexible films 210, display drivers 220, a circuit board 230, a timing controller 240, a power supply 250, gate drivers 260, and protective metal layers 300.

The display panel 100 may be rectangular in plan view. The display panel 100 may be shaped like a rectangular plane having short sides in a first direction DR1, and long sides in the second direction DR2. Each corner where a short side extending in the first direction DR1 meets a long side extending in the second direction DR2 may be right-angled, or may be rounded with a curvature (e.g., predetermined curvature). The planar shape of the display panel 100 is not limited to a rectangular shape, and may also be another polygonal shape, a circular shape, or an oval shape. The display panel 100 may be formed flat, but the disclosure is not limited thereto. In one or more other embodiments, the display panel 100 may be formed to be bent with a curvature (e.g., predetermined curvature).

The display panel 100 may include a display area DA and a non-display area NDA.

The display area DA may be an area for displaying an image, and may be defined as a central area of the display panel 100. The display area DA may include subpixels SP, gate lines GL, data lines DL, initialization voltage lines VIL, first voltage lines VDL, horizontal voltage lines HVDL, vertical voltage lines VVSL, and second voltage lines VSL. The subpixels SP may be respectively formed in pixel areas intersected by the data lines DL and the gate lines GL.

The display device 10 may include a plurality of subpixels SP constituting one pixel PX. The subpixels SP may include first, second, and third subpixels SP1, SP2, and SP3. Each of the first, second, and third subpixels SP1, SP2, and SP3 may be connected to one gate line GL and one data line DL. Each of the first, second, and third subpixels SP1, SP2, and SP3 may be defined as a minimum unit area that outputs light.

Each of the first, second, and third subpixels SP1, SP2, and SP3 may include an organic light-emitting diode including an organic light-emitting layer, a quantum dot light-emitting diode including a quantum dot light-emitting layer, a micro-light-emitting diode, or an inorganic light-emitting diode including an inorganic semiconductor.

The first subpixels SP1 may emit light of a first color or red light, the second subpixels SP2 may emit light of a second color or green light, and the third subpixels SP3 may emit light of a third color or blue light. Pixel circuits of the first subpixels SP1, pixel circuits of the third subpixels SP3, and pixel circuits of the second subpixels SP2 may be arranged in the first direction DR1, but the order of the pixel circuits is not limited thereto.

The gate lines GL may extend in the second direction DR2 and may be spaced apart from each other in the first direction DR1. The gate lines GL may receive gate signals from the gate drivers 260, and may supply the gate signals to auxiliary gate lines BGL. The auxiliary gate lines BGL may extend from the gate lines GL to supply the gate signals to the first, second, and third pixels SP1, SP2, and SP3.

The data lines DL may extend in the first direction DR1, and may be spaced apart from each other in the second direction DR2. The data lines DL may include first, second, and third data lines DL1, DL2, and DL3. The first, second, and third data lines DL1, DL2, and DL3 may supply data voltages to the first, second, and third subpixels SP1, SP2, and SP3, respectively.

The initialization voltage lines VIL may extend in the first direction DR1, and may be spaced apart from each other in the second direction DR2. The initialization voltage lines VIL may supply an initialization voltage received from the display drivers 220 to the pixel circuits of the first, second, and third pixels SP1, SP2, and SP3. The initialization voltage lines VIL may receive sensing signals from the pixel circuits of the first, second, and third subpixels SP1, SP2, and SP3, and may supply the sensing signals to the display drivers 220.

The first voltage lines VDL may extend in the first direction DR1, and may be spaced apart from each other in the second direction DR2. The first voltage lines VDL may supply a driving voltage, or a high potential voltage received from the power supply 250, to the first, second, and third subpixels SP1, SP2, and SP3.

The horizontal voltage lines HVDL may extend in the second direction DR2 and may be spaced apart from each other in the first direction DR1. The horizontal voltage lines HVDL may be connected to the first voltage lines VDL. The horizontal voltage lines HVDL may receive a driving voltage or a high potential voltage from the first voltage lines VDL.

The vertical voltage lines VVSL may extend in the first direction DR1 and may be spaced apart from each other in the second direction DR2. The vertical voltage lines VVSL may be connected to the second voltage lines VSL. The vertical voltage lines VVSL may supply a low potential voltage received from the power supply 250 to the second voltage lines VSL.

The second voltage lines VSL may extend in the second direction DR2, and may be spaced apart from each other in the first direction DR1. The second voltage lines VSL may supply a low potential voltage to the first, second, and third pixels SP1, SP2, and SP3.

The connection relationship between the subpixels SP, the gate lines GL, the data lines DL, the initialization voltage lines VIL, the first voltage lines VDL, and the second voltage lines VSL may be designed and changed according to the number and arrangement of the subpixels SP.

The non-display area NDA may be defined as an area other than the display area DA in the display panel 100. The non-display area NDA may include fan-out lines connecting the data lines DL, the initialization voltage lines VIL, the first voltage lines VDL, and the vertical voltage lines VVSL to the display drivers 220, and may include the gate drivers 260 and pad units connected to the flexible films 210.

The flexible films 210 may be connected to the pad units located on a lower side of the non-display area NDA. Input terminals provided on one side of the flexible films 210 may be attached to the circuit board 230 by a film-attaching process, and output terminals provided on the other side of the flexible films 210 may be attached to the pad units by a film-attaching process. Each of the flexible films 210 may be bent like a tape carrier package or a chip on film. The flexible films 210 may be bent toward the bottom of the display panel 100 to reduce a bezel area of the display device 10.

The display drivers 220 may be mounted on the flexible films 210. The display drivers 220 may be implemented as integrated circuits (ICs). The display drivers 220 may receive digital video data and a data control signal from the timing controller 240, may convert the digital video data into analog data voltages according to the data control signal, and may supply the analog data voltages to the data lines DL through the fan out lines.

The circuit board 230 may support the timing controller 240 and the power supply 250, and may supply signals and power to the display drivers 220. The circuit board 230 may transmit a signal supplied from the timing controller 240, and a power supply voltage supplied from the power supply 250, to the flexible films 210 and the display drivers 220 to display an image with the pixels. To this end, signal lines and power lines may be provided on the circuit board 230.

The timing controller 240 may be mounted on the circuit board 230, and may receive image data and a timing synchronization signal from a display driving system or a graphics device through a user connector provided on the circuit board 230. The timing controller 240 may generate digital video data by arranging the image data according to the pixel arrangement structure based on the timing synchronization signal, and may supply the generated digital video data to the display drivers 220. The timing controller 240 may generate a data control signal and a gate control signal based on the timing synchronization signal. The timing controller 240 may control the supply timing of data voltages of the display drivers 220 based on the data control signal, and may control the supply timing of gate signals of the gate drivers 260 based on the gate control signal.

The power supply 250 may be located on (e.g., above) the circuit board 230 to supply a power supply voltage to the flexible films 210, the display drivers 220, and the gate drivers 260. The power supply 250 may generate and supply a driving voltage or a high potential voltage to the first voltage lines VDL, may generate and supply a low potential voltage to the vertical voltage lines VVSL, and may generate and supply an initialization voltage to the initialization voltage lines VIL. The power supply 250 may generate and supply a gate high voltage and a gate low voltage to the gate drivers 260.

The gate drivers 260 may be located on left and/or right sides of the non-display area NDA. The gate drivers 260 may generate gate signals based on a gate control signal supplied from the timing controller 240. The gate control signal may include, but is not limited to, a start signal, a clock signal, and a power supply voltage. The gate drivers 260 may supply the gate signals to the gate lines GL according to a set order.

The protective metal layers 300 may be located on the left and/or right sides of the non-display area NDA to overlap the gate drivers 260. The protective metal layers 300 may be located on the gate drivers 260 to protect the gate drivers 260. The protective metal layers 300 may receive a power supply voltage from the power supply 250. The protective metal layers 300 may receive a low potential voltage from the power supply 250 to eliminate static electricity applied from the outside.

Figure 3:
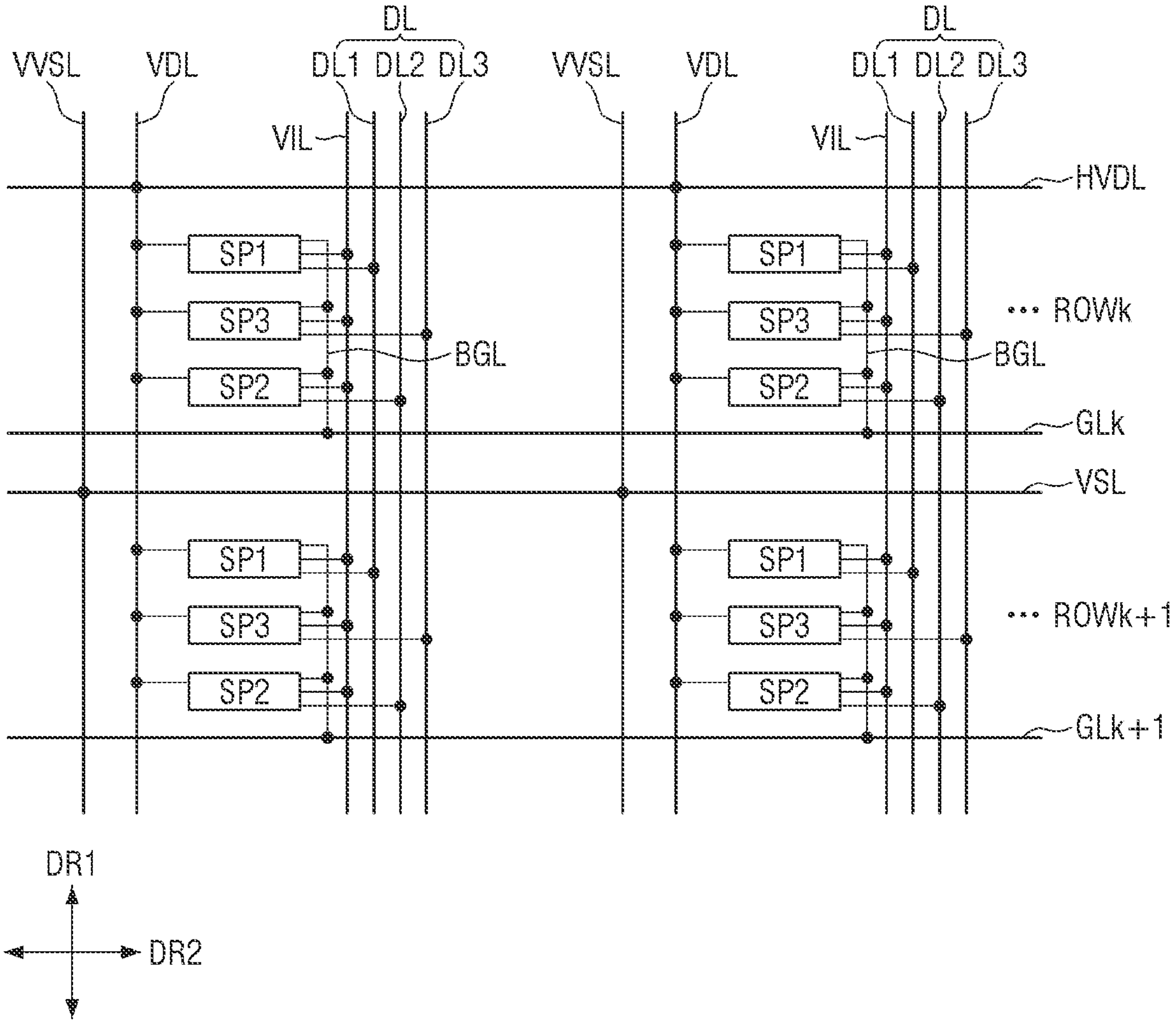
FIG. 3 illustrates pixels and lines of the display device according to one or more embodiments.

FIG. 3 illustrates pixels and lines of the display device 10 according to one or more embodiments.

Referring to FIG. 3, the subpixels SP may include the first, second, and third subpixels SP1, SP2, and SP3. The pixel circuits of the first subpixels SP1, the pixel circuits of the third subpixels SP3, and the pixel circuits of the second subpixels SP2 may be arranged in a direction opposite to the first direction DR1, but the order of the pixel circuits is not limited thereto.

Each of the first, second, and third subpixels SP1, SP2, and SP3 may be connected to a first voltage line VDL, an initialization voltage line VIL, a gate line GL, and a data line DL.

The first voltage lines VDL may extend in the first direction DR1. The first voltage lines VDL may be located on left sides of the pixel circuits of the first, second, and third subpixels SP1, SP2, and SP3. The first voltage lines VDL may supply a driving voltage or a high potential voltage to transistors of the first, second, and third subpixels SP1, SP2, and SP3.

A horizontal voltage line HVDL may extend in the second direction DR2. The horizontal voltage line HVDL may be located above the pixel circuits of the first subpixels SP1 located in a $k^{th}$ row ROWk (where k is a positive integer). The horizontal voltage line HVDL may be connected to the first voltage lines VDL. The horizontal voltage line HVDL may receive a driving voltage or a high potential voltage from the first voltage lines VDL.

The vertical voltage lines VVSL may extend in the first direction DR1. The vertical voltage lines VVSL may be located on left sides of the first voltage lines VDL. The vertical voltage lines VVSL may be connected between the power supply 250 and a second voltage line VSL. The vertical voltage lines VVSL may supply a low potential voltage supplied from the power supply 250 to the second voltage line VSL.

The second voltage line VSL may extend in the second direction DR2. The second voltage line VSL may be located above the pixel circuits of the first subpixels SP1 located in a $(k+1)^{th}$ row ROWk+1. The second voltage line VSL may supply a low potential voltage received from the vertical voltage lines VVSL to light-emitting element layers of the first, second, and third subpixels SP1, SP2, and SP3.

The gate lines GL may extend in the second direction DR2. The gate lines GL may be located below the pixel circuits of the second subpixels SP2. Each of the gate lines GL may supply a gate signal received from the gate drivers 260 to the auxiliary gate lines BGL. A $k^{th}$ gate line GLk may supply a gate signal to the subpixels SP located in the $k^{th}$ row ROWk, and a $(k+1)^{th}$ gate line GLk+1 may supply a gate signal to the subpixels SP located in the $(k+1)^{th}$ row ROWk+1.

The auxiliary gate lines BGL may extend in the first direction DR1 from each of the gate lines GL. Each of the auxiliary gate lines BGL may be located on right sides of the pixel circuits of the first, second, and third subpixels SP1, SP2, and SP3. Each of the auxiliary gate lines BGL may supply a gate signal received from a gate line GL to the pixel circuits of the first, second, and third subpixels SP1, SP2, and SP3.

The initialization voltage lines VIL may extend in the first direction DR1. The initialization voltage lines VIL may be located on right sides of the auxiliary gate lines BGL. The initialization voltage lines VIL may supply an initialization voltage to the pixel circuits of the first, second, and third subpixels SP1, SP2, and SP3. The initialization voltage lines VIL may receive sensing signals from the pixel circuits of the first, second, and third subpixels SP1, SP2, and SP3, and may supply the sensing signals to the display drivers 220.

The data lines DL may extend in the first direction DR1. The data lines DL may supply data voltages to the subpixels SP. The data lines DL may include the first, second, and third data lines DL1, DL2, and DL3.

The first data lines DL1 may extend in the first direction DR1. The first data lines DL1 may be located on right sides of the initialization voltage lines VIL. The first data lines DL1 may supply data voltages received from the display drivers 220 to the pixel circuits of the first subpixels SP1.

The second data lines DL2 may extend in the first direction DR1. The second data lines DL2 may be located on right sides of the first data lines DL1. The second data lines DL2 may supply data voltages received from the display drivers 220 to the pixel circuits of the second subpixels SP2.

The third data lines DL3 may extend in the first direction DR1. The third data lines DL3 may be located on right sides of the second data lines DL2. The third data lines DL3 may supply data voltages received from the display drivers 220 to the pixel circuits of the third subpixels SP3.

Figure 4:
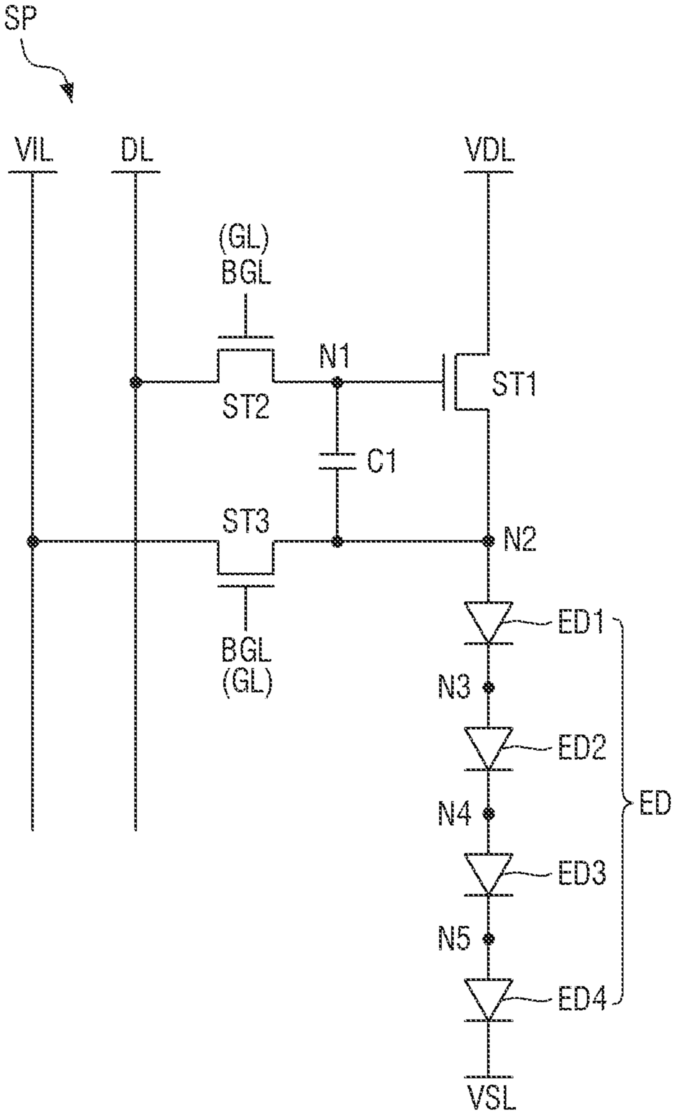
FIG. 4 is a circuit diagram of a subpixel of the display device according to one or more embodiments.

FIG. 4 is a circuit diagram of a subpixel SP of the display device 10 according to one or more embodiments.

Referring to FIG. 4, each of the subpixels SP may be connected to a first voltage line VDL, a data line DL, an initialization voltage line VIL, a gate line GL, and a second voltage line VSL.

Each of the first, second, and third subpixels SP1, SP2, and SP3 may include a pixel circuit and a plurality of light-emitting elements ED. The pixel circuit may include first, second, and third transistors ST1, ST2, and ST3 and a first capacitor C1.

The first transistor ST1 may include a gate electrode, a drain electrode, and a source electrode. The first transistor ST1 may have the gate electrode connected to a first node N1, the drain electrode connected to the first voltage line VDL, and the source electrode connected to a second node N2. The first transistor ST1 may control a drain-source current (or driving current) based on a data voltage applied to the gate electrode.

The light-emitting elements ED may include first through fourth light-emitting elements ED1 through ED4. The first through fourth light-emitting elements ED1 through ED4 may be connected in series. The first through fourth light-emitting elements ED1 through ED4 may emit light in response to a driving current. The amount of light emitted from the light-emitting elements ED or the luminance of the light-emitting elements ED may be proportional to the magnitude of the driving current. Each of the light-emitting elements ED may include an organic light-emitting diode including an organic light-emitting layer, a quantum dot light-emitting diode including a quantum dot light-emitting layer, a micro-light-emitting diode, or an inorganic light-emitting diode including an inorganic semiconductor.

A first electrode of the first light-emitting element ED1 may be connected to the second node N2, and a second electrode of the first light-emitting element ED1 may be connected to a third node N3. The first electrode of the first light-emitting element ED1 may be connected to the source electrode of the first transistor ST1, a drain electrode of the third transistor ST3, and a second capacitor electrode of the first capacitor C1 through the second node N2. The second electrode of the first light-emitting element ED1 may be connected to a first electrode of the second light-emitting element ED2 through the third node N3.

The first electrode of the second light-emitting element ED2 may be connected to the third node N3, and a second electrode of the second light-emitting element ED2 may be connected to a fourth node N4. A first electrode of the third light-emitting element ED3 may be connected to the fourth node N4, and a second electrode of the third light-emitting element ED3 may be connected to a fifth node N5. A first electrode of the fourth light-emitting element ED4 may be connected to the fifth node N5, and a second electrode of the fourth light-emitting element ED4 may be connected to the second voltage line VSL.

The second transistor ST2 may be turned on by a gate signal of the gate line GL to electrically connect the data line DL and the first node N1, which is the gate electrode of the first transistor ST1. The second transistor ST2 may be turned on based on the gate signal to supply a data voltage to the first node N1. The second transistor ST2 may have a gate electrode connected to the gate line GL, a drain electrode connected to the data line DL, and a source electrode connected to the first node N1. The source electrode of the second transistor ST2 may be connected to the gate electrode of the first transistor ST1 and a first capacitor electrode of the first capacitor C1 through the first node N1.

The third transistor ST3 may be turned on by the gate signal of the gate line GL to electrically connect the initialization voltage line VIL and the second node N2, which is the source electrode of the first transistor ST1. The third transistor ST3 may be turned on based on the gate signal to supply an initialization voltage to the second node N2. The third transistor ST3 may be turned on based on the gate signal to supply a sensing signal to the initialization voltage line VIL. The third transistor ST3 may have a gate electrode connected to the gate line GL, the drain electrode connected to the second node N2, and a source electrode connected to the initialization voltage line VIL. The drain electrode of the third transistor ST3 may be connected to the source electrode of the first transistor ST1, the second capacitor electrode of the first capacitor C1, and the first electrode of the first light-emitting element ED1 through the second node N2.

Figure 5:
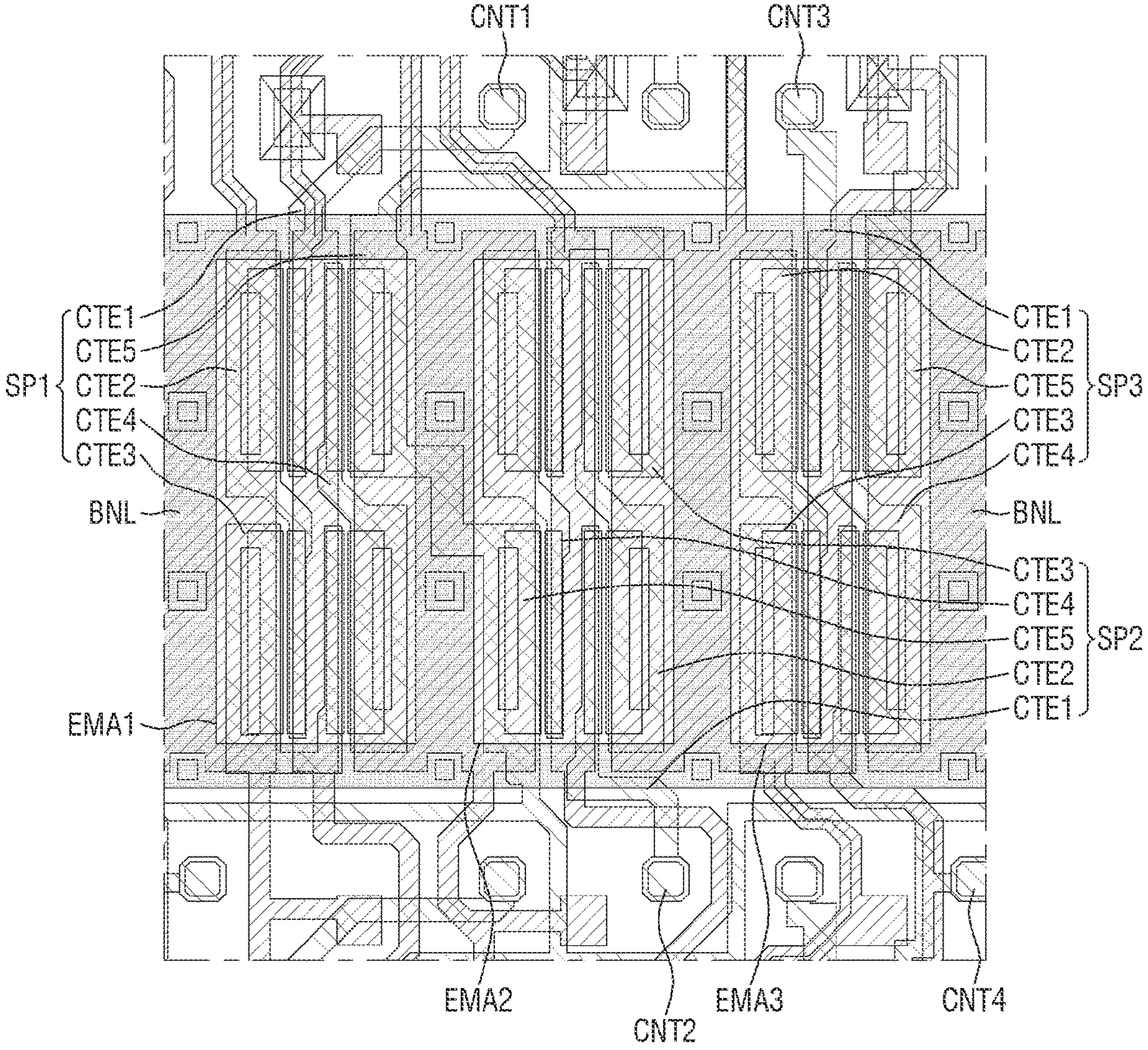
FIG. 5 is a plan view of a light-emitting element layer of the display device according to one or more embodiments.
Figure 6:
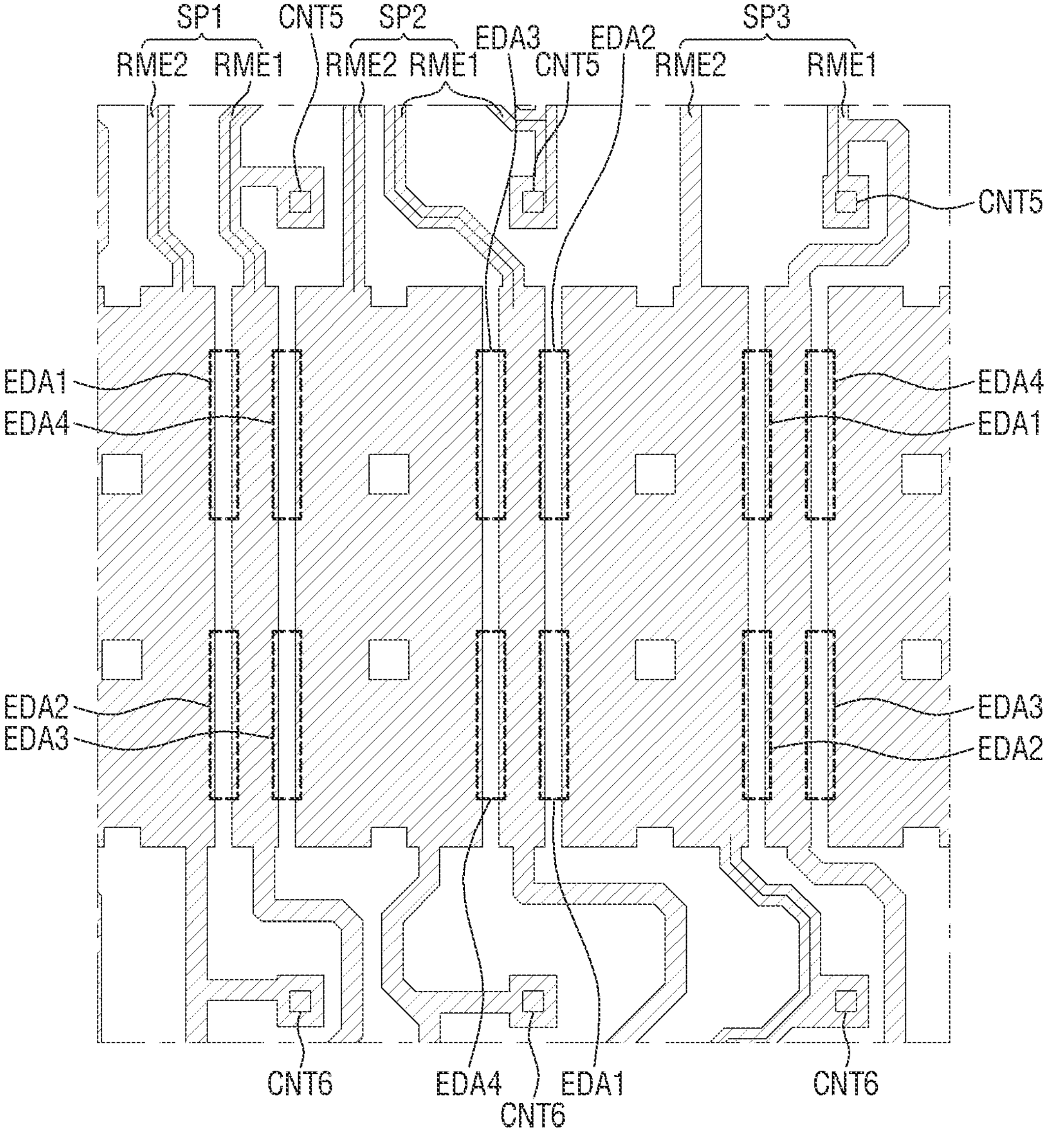
FIG. 6 is a plan view of a fourth metal layer of the display device according to one or more embodiments.
Figure 7:
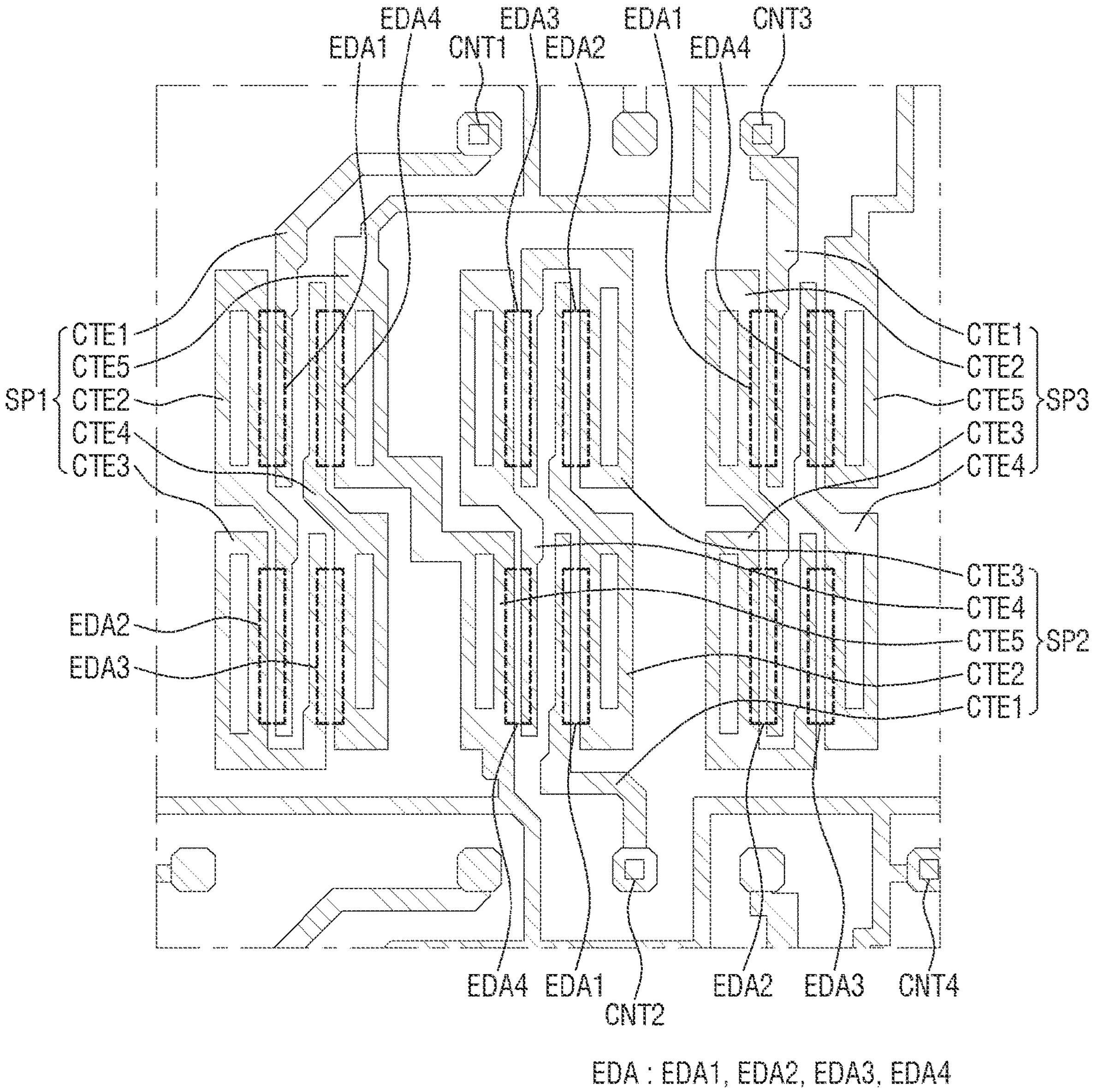
FIG. 7 is a plan view of a fifth metal layer of the display device according to one or more embodiments.
Figure 8:
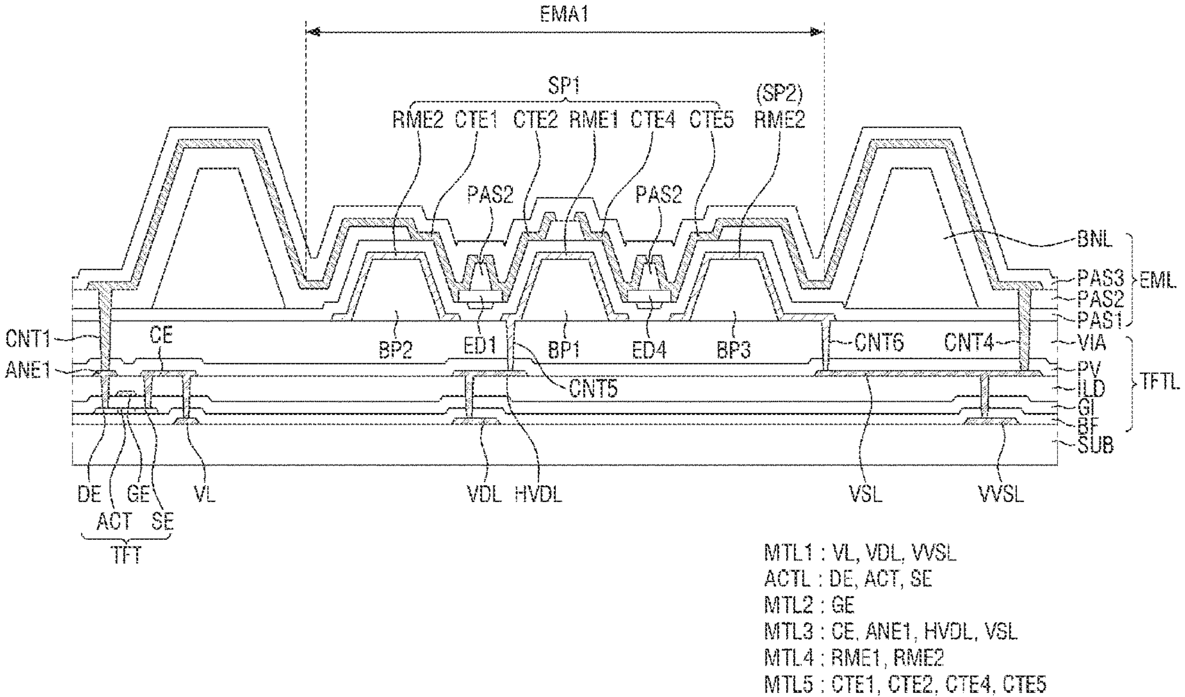
FIG. 8 is a schematic cross-sectional view of the display device according to one or more embodiments.

FIG. 5 is a plan view of a light-emitting element layer EML of the display device 10 according to one or more embodiments. FIG. 6 is a plan view of a fourth metal layer MTL4 of the display device 10 according to one or more embodiments. FIG. 7 is a plan view of a fifth metal layer MTL5 of the display device 10 according to one or more embodiments. FIG. 8 is a schematic cross-sectional view of the display device 10 according to one or more embodiments.

Referring to FIGS. 5 through 8, the display panel 100 may include a substrate SUB, a thin-film transistor layer TFTL, and the light-emitting element layer EML.

The substrate SUB may be a base substrate or a base member. The substrate SUB may be a flexible substrate that can be bent, folded, or rolled. The substrate SUB may include a glass material or a metal material, but the disclosure is not limited thereto. In one or more other embodiments, the substrate SUB may include polymer resin, such as polyimide (PI).

The thin-film transistor layer TFTL may be located on (e.g., above) the substrate SUB. The thin-film transistor layer TFTL may include a first metal layer MTL1, a buffer layer BF, an active layer ACTL, a gate-insulating layer GI, a second metal layer MTL2, an interlayer insulating layer ILD, a third metal layer MTL3, a passivation layer PV, and a via layer VIA.

The first metal layer MTL1 may be located on (e.g., above) the substrate SUB. The first metal layer MTL1 may include a voltage line VL, a first voltage line VDL, and a vertical voltage line VVSL. The voltage line VL may be a first voltage line VDL, an initialization voltage line VIL, or a data line DL.

The buffer layer BF may be located on (e.g., above) the first metal layer MTL1. The buffer layer BF may include an inorganic layer that may reduce or prevent penetration of air or moisture. The buffer layer BF may include a plurality of inorganic layers stacked alternately.

The active layer ACTL may be located on (e.g., above) the buffer layer BF. The active layer ACTL may include a drain electrode DE, a semiconductor region ACT, and a source electrode SE of a thin-film transistor TFT. The thin-film transistor TFT may be the first transistor ST1 of FIG. 3, but the disclosure is not limited thereto. The semiconductor region ACT of the thin-film transistor TFT may include low-temperature polycrystalline silicon (LTPS). The thin-film transistor TFT including low-temperature polycrystalline silicon may have relatively high electron mobility and suitable turn-on characteristics. In one or more other embodiments, the semiconductor region ACT of the thin-film transistor TFT may include an oxide. The thin-film transistor TFT including an oxide may have suitable leakage current characteristics, and may reduce power consumption because it can be driven at a relatively low frequency.

The gate-insulating layer GI may be located on (e.g., above) the active layer ACTL. The gate-insulating layer GI may insulate the active layer ACTL from the second metal layer MTL2.

The second metal layer MTL2 may be located on (e.g., above) the gate-insulating layer GI. The second metal layer MTL2 may include a gate electrode GE of the thin-film transistor TFT. The gate electrode GE of the thin-film transistor TFT may overlap the semiconductor region ACT.

The interlayer insulating layer ILD may be located on (e.g., above) the second metal layer MTL2. The interlayer insulating layer ILD may insulate the second metal layer MTL2 from the third metal layer MTL3.

The third metal layer MTL3 may be located on (e.g., above) the interlayer insulating layer ILD. The third metal layer MTL3 may include a connection electrode CE, a first anode connection electrode ANE1, a horizontal voltage line HVDL, and a second voltage line VSL. The connection electrode CE may electrically connect the voltage line VL and the source electrode SE of the thin-film transistor TFT. The first anode connection electrode ANE1 may electrically connect the drain electrode DE of the thin-film transistor TFT and a first contact electrode CTE1. The horizontal voltage line HVDL may electrically connect the first voltage line VDL and a first electrode RME1. The second voltage line VSL may electrically connect the vertical voltage line VVSL and a second electrode RME2, and may electrically connect the vertical voltage line VVSL and a fifth contact electrode CTE5.

The passivation layer PV may be located on (e.g., above) the third metal layer MTL3. The passivation layer PV may be located on (e.g., above) a plurality of thin-film transistors TFT to protect the pixel circuits of the subpixels SP.

The via layer VIA may be located on (e.g., above) the passivation layer PV. The via layer VIA may planarize an upper end of the thin-film transistor layer TFTL. The via layer VIA may include an organic insulating material, such as polyimide (PI).

The light-emitting element layer EML may be located on (e.g., above) the thin-film transistor layer TFTL. The light-emitting element layer EML may include first, second, and third bank patterns BP1, BP2, and BP3, the first and second electrodes RME1 and RME2, a first insulating layer PAS1, the first through fourth light-emitting elements ED1 through ED4, a bank layer BNL, a second insulating layer PAS2, first, second, third, fourth, and fifth contact electrodes CTE1, CTE2, CTE3, CTE4, and CTE5, and a third insulating layer PAS3.

The bank layer BNL may define first, second, and third emission areas EMA1, EMA2, and EMA3. The light-emitting elements ED of a first subpixel SP1 may be located in the first emission area EMA1, the light-emitting elements ED of a second subpixel SP2 may be located in the second emission area EMA2, and the light-emitting elements ED of a third subpixel SP3 may be located in the third emission area EMA3. FIG. 8 is a schematic cross-sectional view of the first emission area EMA1.

The first, second, and third bank patterns BP1, BP2, and BP3 may extend in the first direction DR1, and may be spaced apart from each other in the second direction DR2. The first bank pattern BP1 may be located between the second and third bank patterns BP2 and BP3. The second bank pattern BP2 may be located on a left side of the first bank pattern BP1, and the third bank pattern BP3 may be located on a right side of the first bank pattern BP1. Each of the first, second, and third bank patterns BP1, BP2, and BP3 may protrude upward (e.g., a Z-axis direction that is substantially perpendicular to the first and second directions DR1 and DR2) from the via layer VIA. Each of the first, second, and third bank patterns BP1, BP2, and BP3 may have inclined side surfaces. A plurality of first and second light-emitting elements ED1 and ED2 of the first subpixel SP1 may be located between the first and second bank patterns BP1 and BP2 spaced apart from each other. A plurality of third and fourth light-emitting elements ED3 and ED4 of the first subpixel SP1 may be located between the first and third bank patterns BP1 and BP3 spaced apart from each other. The first, second, and third bank patterns BP1, BP2, and BP3 may be located as island patterns in the entire display area DA.

The first and second electrodes RME1 and RME2 of each of the first, second, and third subpixels SP1, SP2, and SP3 may be located in the fourth metal layer MTL4. A maximum width of the second electrode RME2 in the second direction DR2 may be greater than a maximum width of the first electrode RME1 in the second direction DR2, but the disclosure is not limited thereto. The fourth metal layer MTL4 may be located on (e.g., above) the via layer VIA and the first, second, and third bank patterns BP1, BP2, and BP3. The first and second electrodes RME1 and RME2 of each of the first, second, and third subpixels SP1, SP2, and SP3 may extend in the first direction DR1. The first electrode RME1 of the first subpixel SP1 may be located between the second electrode RME2 of the first subpixel SP1 and the second electrode RME2 of the second subpixel SP2. The first electrode RME1 of the second subpixel SP2 may be located between the second electrode RME2 of the second subpixel SP2 and the second electrode RME2 of the third subpixel SP3. The first electrode RME1 of the third subpixel SP3 may be located on a right side of the second electrode RME2 of the third subpixel SP3.

The first and second electrodes RME1 and RME2 may respectively cover upper inclined side surfaces of one of the first, second, and third bank patterns BP1, BP2, and BP3. The first and second electrodes RME1 and RME2 may be reflective electrodes. The fourth metal layer MTL4 may be a single layer or a multilayer made of at least one of molybdenum (Mo), aluminum (Al), chromium (Cr), gold (Au), silver (Ag), titanium (Ti), nickel (Ni), palladium (Pd), indium (In), neodymium (Nd), or copper (Cu). The fourth metal layer MTL4 may include at least one layer including a material having relatively high reflectivity. Therefore, each of the first and second electrodes RME1 and RME2 may reflect light, which is emitted from the first through fourth light-emitting elements ED1 through ED4, in an upward direction.

The first and second electrodes RME1 and RME2 may be alignment electrodes that align the first through fourth light-emitting elements ED1 through ED4 in a process of manufacturing the display device 10. A plurality of first electrodes RME1 may be connected to the horizontal voltage line HVDL of the third metal layer MTL3 through a plurality of fifth through holes CNT5. The first electrodes RME1 may receive a driving voltage or a high potential voltage from the horizontal voltage line HVDL. A plurality of second electrodes RME2 may be connected to the second voltage line VSL of the third metal layer MTL3 through a plurality of sixth through holes CNT6. The second electrodes RME2 may receive a low potential voltage from the second voltage line VSL.

A plurality of light-emitting elements ED may be aligned between the first electrode RME1 and the second electrode RME2. The light-emitting elements ED may be located in light-emitting element areas EDA. A plurality of first light-emitting elements ED1 may be located in a first light-emitting element area EDA1, a plurality of second light-emitting elements ED2 may be located in a second light-emitting element area EDA2, a plurality of third light-emitting elements ED3 may be located in a third light-emitting element area EDA3, and a plurality of fourth light-emitting elements ED4 may be located in a fourth light-emitting element area EDA4. The first and second light-emitting element areas EDA1 and EDA2 may be located between the first electrode RME1 of the first subpixel SP1 and the second electrode RME2 of the first subpixel SP1. The third and fourth light-emitting element areas EDA3 and EDA4 may be located between the first electrode RME1 of the first subpixel SP1 and the second electrode RME2 of the second subpixel SP2. The first insulating layer PAS1 may cover the first and second electrodes RME1 and RME2. The first insulating layer PAS1 may include an inorganic layer. The first through fourth light-emitting elements ED1 through ED4 may be insulated from the first and second electrodes RME1 and RME2 by the first insulating layer PAS1.

Each of the first and second electrodes RME1 and RME2 may receive an alignment signal, and an electric field may be formed between the first and second electrodes RME1 and RME2. The first through fourth light-emitting elements ED1 through ED4 may be sprayed onto the first and second electrodes RME1 and RME2 through an inkjet printing process. The first through fourth light-emitting elements ED1 through ED4 dispersed in ink may be aligned by a dielectrophoretic force applied by the electric field formed between the first and second electrodes RME1 and RME2. Therefore, the first through fourth light-emitting elements ED1 through ED4 may be aligned along the first direction DR1 between the first and second electrodes RME1 and RME2.

The first, second, third, fourth, and fifth contact electrodes CTE1, CTE2, CTE3, CTE4, and CTE5 of each of the first, second, and third subpixels SP1, SP2, and SP3 may be located in the fifth metal layer MTL5. The first, second, third, fourth, and fifth contact electrodes CTE1, CTE2, CTE3, CTE4, and CTE5 may be transparent electrodes. The fifth metal layer MTL5 may include a material, such as indium tin oxide (ITO), indium zinc oxide (IZO), or indium tin zinc oxide (ITZO). The fifth metal layer MTL5 may have, but is not limited to, a stacked structure of ITO/Ag/ITO, ITO/Ag/IZO, or ITO/Ag/ITZO/IZO.

The second insulating layer PAS2 may be located on (e.g., above) the bank layer BNL, the first insulating layer PAS1, and the light-emitting elements ED. The third insulating layer PAS3 may cover the second insulating layer PAS2 and the first, second, third, fourth, and fifth contact electrodes CTE1, CTE2, CTE3, CTE4, and CTE5. Each of the second and third insulating layers PAS2 and PAS3 may include an inorganic layer. The second and third insulating layers PAS2 and PAS3 may insulate the first, second, third, fourth, and fifth contact electrodes CTE1, CTE2, CTE3, CTE4, and CTE5 from each other. Each of the second, third, fourth, and fifth contact electrodes CTE2, CTE3, CTE4, and CTE5 may include an opening in the center thereof, but the disclosure is not limited thereto.

The first contact electrode CTE1 of the first subpixel SP1 may be located on (e.g., above) the first electrode RME1 of the first subpixel SP1, and may be connected to the first anode connection electrode ANE1 of the third metal layer MTL3 through a first through hole CNT1. The first contact electrode CTE1 may be connected between the first anode connection electrode ANE1 and first ends of the first light-emitting elements ED1. The first contact electrode CTE1 may receive a driving current passing through the first transistor ST1 of FIG. 3. The first contact electrode CTE1 may supply the driving current to the first light-emitting elements ED1 of the first subpixel SP1. The first contact electrode CTE1 may correspond to anodes of the first light-emitting elements ED1, but the disclosure is not limited thereto.

The second contact electrode CTE2 may be insulated from the first and second electrodes RME1 and RME2. A first portion of the second contact electrode CTE2 may be located on (e.g., above) the second electrode RME2 of the first subpixel SP1 and may extend in the first direction DR1. A second portion of the second contact electrode CTE2 may extend from a lower side of the first portion, and may be located on (e.g., above) the first electrode RME1 of the first subpixel SP1.

The second contact electrode CTE2 may be connected between second ends of the first light-emitting elements ED1 and first ends of the second light-emitting elements ED2. The second contact electrode CTE2 may correspond to the third node N3 of FIG. 3. The second contact electrode CTE2 may correspond to cathodes of the first light-emitting elements ED1, but the disclosure is not limited thereto. The second contact electrode CTE2 may correspond to anodes of the second light-emitting elements ED2, but the disclosure is not limited thereto.

The third contact electrode CTE3 may be insulated from the first and second electrodes RME1 and RME2. A first portion of the third contact electrode CTE3 may be located on (e.g., above) the second electrode RME2 of the first subpixel SP1 and may extend in the first direction DR1. A second portion of the third contact electrode CTE3 may be located on (e.g., above) the first electrode RME1 of the first subpixel SP1 and may be located on a right side of the first portion.

The third contact electrode CTE3 may be connected between second ends of the second light-emitting elements ED2 and first ends of the third light-emitting elements ED3. The third contact electrode CTE3 may correspond to the fourth node N4 of FIG. 3. The third contact electrode CTE3 may correspond to cathodes of the second light-emitting elements ED2, but the disclosure is not limited thereto. The third contact electrode CTE3 may correspond to anodes of the third light-emitting elements ED3, but the disclosure is not limited thereto.

The fourth contact electrode CTE4 may be insulated from the first and second electrodes RME1 and RME2. A first portion of the fourth contact electrode CTE4 may be located on (e.g., above) the second electrode RME2 of the second subpixel SP2 and may extend in the first direction DR1. A second portion of the fourth contact electrode CTE4 may extend from an upper side of the first portion, and may be located on (e.g., above) the first electrode RME1 of the first subpixel SP1.

The fourth contact electrode CTE4 may be connected between second ends of the third light-emitting elements ED3 and first ends of the fourth light-emitting elements ED4. The fourth contact electrode CTE4 may correspond to the fifth node N5 of FIG. 3. The fourth contact electrode CTE4 may correspond to cathodes of the third light-emitting elements ED3, but the disclosure is not limited thereto. The fourth contact electrode CTE4 may correspond to anodes of the fourth light-emitting elements ED4, but the disclosure is not limited thereto.

The fifth contact electrode CTE5 may be connected between the second ends of the fourth light-emitting elements ED4 and the second voltage line VSL. The fifth contact electrode CTE5 may be located on (e.g., above) the second electrode RME2 of the second subpixel SP2, and may extend in the first direction DR1. The fifth contact electrode CTE5 may be connected to the second voltage line VSL of the third metal layer MTL3 through a fourth through hole CNT4. The fifth contact electrode CTE5 may correspond to cathodes of the fourth light-emitting elements ED4, but the disclosure is not limited thereto. The fifth contact electrode CTE5 may receive a low potential voltage through the second voltage line VSL. The fifth contact electrodes CTE5 of the first, second, and third subpixels SP1, SP2, and SP3 may be integrally formed, but the disclosure is not limited thereto.

The first contact electrode CTE1 of the second subpixel SP2 may be located on (e.g., above) the first electrode RME1 of the second subpixel SP2, and may be connected to the pixel circuit of the second subpixel SP2 through a second through hole CNT2. The first contact electrode CTE1 may be connected between the pixel circuit of the second subpixel SP2 and the first ends of the first light-emitting elements ED1. The first contact electrode CTE1 may receive a driving current passing through the first transistor ST1 of the second subpixel SP2. The first contact electrode CTE1 may supply the driving current to the first light-emitting elements ED1 of the second subpixel SP2.

The first contact electrode CTE1 of the third subpixel SP3 may be located on (e.g., above) the first electrode RME1 of the third subpixel SP3, and may be connected to the pixel circuit of the third subpixel SP3 through a third through hole CNT3. The first contact electrode CTE1 may be connected between the pixel circuit of the third subpixel SP3 and the first ends of the first light-emitting elements ED1. The first contact electrode CTE1 may receive a driving current passing through the first transistor ST1 of the third subpixel SP3. The first contact electrode CTE1 may supply the driving current to the first light-emitting elements ED1 of the third subpixel SP3.

Figure 9:
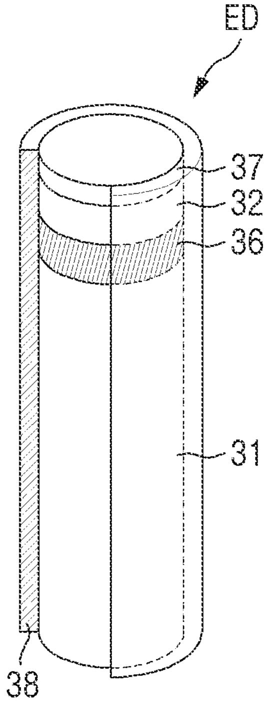
FIG. 9 is a schematic view of a light-emitting element according to one or more embodiments.

FIG. 9 is a schematic view of a light-emitting element ED according to one or more embodiments.

Referring to FIG. 9, the light-emitting element ED may be a light-emitting diode. Specifically, the light-emitting element ED may be an inorganic light-emitting diode having a size of nanometers to micrometers and made of an inorganic material. When an electric field is formed in a corresponding direction between two electrodes facing each other, the light-emitting element ED may be aligned between the two electrodes in which polarities are formed.

The light-emitting element ED according to one or more embodiments may extend in one direction. The light-emitting element ED may be shaped like a cylinder, a rod, a wire, a tube, or the like. However, the shape of the light-emitting element ED is not limited thereto, and the light-emitting element ED may also have various shapes including polygonal prisms, such as a cube, a rectangular parallelepiped or a hexagonal prism, and a shape extending in a direction and having a partially inclined outer surface.

The light-emitting element ED may include a semiconductor layer doped with a dopant of any conductivity type (e.g., a p-type or an n-type). The semiconductor layer may receive an electrical signal from an external power source and emit light of a corresponding wavelength band. The light-emitting element ED may include a first semiconductor layer 31, a second semiconductor layer 32, a light-emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \le x \le 1$, $0 \le y \le 1$, $0 \le x+y \le 1$). The first semiconductor layer 31 may be any one or more of AlGaInN, GaN, AlGaN, InGaN, AlN, and/or InN doped with an n-type dopant. The n-type dopant used to dope the first semiconductor layer 31 may be Si, Ge, Sn, or the like.

The second semiconductor layer 32 is located on the first semiconductor layer 31 with the light-emitting layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \le x \le 1$, $0 \le y \le 1$, $0 \le x+y \le 1$). The second semiconductor layer 32 may be any one or more of AlGaInN, GaN, AlGaN, InGaN, AlN, and/or InN doped with a p-type dopant. The p-type dopant used to dope the second semiconductor layer 32 may be Mg, Zn, Ca, Ba, or the like.

Although each of the first semiconductor layer 31 and the second semiconductor layer 32 is composed of one layer in the drawing, the disclosure is not limited thereto. Each of the first semiconductor layer 31 and the second semiconductor layer 32 may also include more layers, and in one or more embodiments, may further include a clad layer or a tensile strain barrier reducing (TSBR) layer depending on the material of the light-emitting layer 36. The light-emitting element ED may further include another semiconductor layer located between the first semiconductor layer 31 and the light-emitting layer 36 or between the second semiconductor layer 32 and the light-emitting layer 36. The semiconductor layer located between the first semiconductor layer 31 and the light-emitting layer 36 may be any one or more of AlGaInN, GaN, AlGaN, InGaN, AlN, InN, and/or SLs doped with an n-type dopant. The semiconductor layer located between the second semiconductor layer 32 and the light-emitting layer 36 may be any one or more of AlGaInN, GaN, AlGaN, InGaN, AlN, and/or InN doped with a p-type dopant.

The light-emitting layer 36 is located between the first semiconductor layer 31 and the second semiconductor layer 32. The light-emitting layer 36 may include a material having a single or multiple quantum well structure. When the light-emitting layer 36 includes a material having a multiple quantum well structure, it may have a structure in which a plurality of quantum layers and a plurality of well layers are alternately stacked. The light-emitting layer 36 may emit light through combination of electron-hole pairs according to electrical signals received through the first semiconductor layer 31 and the second semiconductor layer 32. The light-emitting layer 36 may include a material, such as AlGaN, AlGaInN, or InGaN. For example, if the light-emitting layer 36 has a multiple quantum well structure in which quantum layers and well layers are alternately stacked, the quantum layers may include a material, such as AlGaN or AlGaInN, and the well layers may include a material, such as GaN or AlInN.

The light-emitting layer 36 may also have a structure in which a semiconductor material having a large band gap energy and a semiconductor material having a small band gap energy are alternately stacked, or may include different group 3 to 5 semiconductor materials depending on the wavelength band of light that it emits. Light emitted from the light-emitting layer 36 is not limited to light in a blue wavelength band. In some cases, the light-emitting layer 36 may emit light in a red or green wavelength band.

The electrode layer 37 may be an ohmic connection electrode. However, the disclosure is not limited thereto, and the electrode layer 37 may also be a Schottky connection electrode. The light-emitting element ED may include at least one electrode layer 37. The light-emitting element ED may include one or more electrode layers 37. However, the disclosure is not limited thereto, and the electrode layer 37 may also be omitted.

When the light-emitting element ED is electrically connected to electrodes or connection electrodes in the display device 10, the electrode layer 37 may reduce the resistance between the light-emitting element ED and the electrodes or the connection electrodes. The electrode layer 37 may include a conductive metal. The electrode layer 37 may include at least any one of aluminum (Al), titanium (Ti), indium (In), gold (Au), silver (Ag), indium tin oxide (ITO), indium zinc oxide (IZO), and/or indium tin zinc oxide (ITZO).

The insulating film 38 surrounds outer surfaces of the semiconductor layers and the electrode layer described above. The insulating film 38 may surround an outer surface of at least the light-emitting layer 36, but may expose both ends of the light-emitting element ED in a longitudinal direction. In addition, an upper surface of the insulating film 38 may be rounded in cross section in an area adjacent to at least one end of the light-emitting element ED.

The insulating film 38 may include an insulating material, and in one or more embodiments may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). Although the insulating film 38 is illustrated as a single layer in the drawing, the disclosure is not limited thereto. In some embodiments, the insulating film 38 may be formed in a multilayer structure in which a plurality of layers are stacked.

The insulating film 38 may protect the semiconductor layers and the electrode layer of the light-emitting element ED. The insulating film 38 may reduce or prevent the likelihood of an electrical short circuit that may occur in the light-emitting layer 36 if the light-emitting layer 36 directly contacts an electrode that transmits an electrical signal to the light-emitting element ED. In addition, the insulating film 38 may reduce or prevent a decrease in luminous efficiency of the light-emitting element ED.

In addition, an outer surface of the insulating film 38 may be treated. The light-emitting element ED may be sprayed onto electrodes in a state where it is dispersed in an ink (e.g., predetermined ink) and then may be aligned. Here, the surface of the insulating film 38 may be hydrophobic or hydrophilic-treated so that the light-emitting element ED is kept separate in the ink without being agglomerated with other adjacent light-emitting elements ED.

Figure 10:
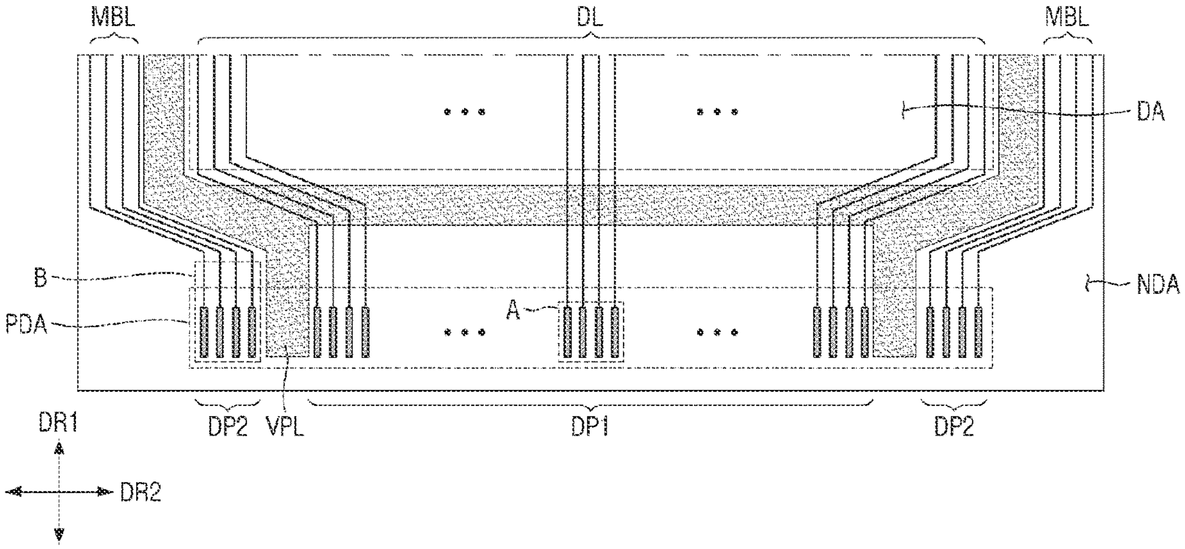
FIG. 10 is a plan view illustrating a pad area and wirings located around the pad area of the display device according to one or more embodiments.

FIG. 10 is a plan view illustrating a pad area PDA and wirings located around the pad area PDA of the display device 10 according to one or more embodiments.

Referring to FIG. 10, the display device 10 according to one or more embodiments may include a plurality of wirings DL, MBL, and VPL located in the non-display area NDA, and a plurality of pads DP1 and DP2 located in the pad area PDA of the non-display area NDA. Some of the wirings DL, MBL, and VPL may extend to the display area DA, and the others may be located in the non-display area NDA. The data lines DL among the wirings may extend from the pad area PDA of the non-display area NDA to the display area DA in the first direction DR1. The data lines DL may be electrically connected to a plurality of first pads DP1 in the pad area PDA.

Connection wirings MBL among the wirings may extend from the pad area PDA in the first direction DR1, but may be partially bent to extend in the non-display area NDA. The connection wirings MBL may extend in the first direction DR1 in the non-display area NDA located on both sides of the display area DA in the second direction DR2. The connection wirings MBL may be electrically connected to second pads DP2 in the pad area PDA, and may be electrically connected to the gate drivers 260 located in the non-display area NDA. In the display device 10, the data lines DL may be inner wirings located in the display area DA, and the connection wirings MBL may be outer wirings located in the non-display area NDA. The first pads DP1 connected to the data lines DL, which are inner wirings, may be inner pads, and the second pads DP2 connected to the connection wirings MBL, which are outer wirings, may be outer pads.

A power connection wiring VPL among the wirings may surround the display area DA by including a portion located in the pad area PDA, and a portion extending in the first direction DR1 and the second direction DR2. The power connection wiring VPL may be electrically connected to a plurality of voltage lines located in the display area DA. In one or more embodiments, the power connection wiring VPL may also be electrically connected to other power pads in the pad area PDA, and may transmit a power supply voltage to the voltage lines.

The pads DP1 and DP2 may be located in the pad area PDA on the lower side of the non-display area NDA, which is a side of the display area DA in the first direction DR1. The pads DP1 and DP2 may include the first pads DP1, which are inner pads located relatively inside, or toward an interior in plan view, and may include the second pads DP2, which are outer pads located outside, or on each side of, the first pads DP1. A plurality of second pads DP2, the first pads DP1, and another plurality of second pads DP2 may be located in the pad area PDA from a left side, which is a side of the display device 10 in the second direction DR2, to a right side. The first pads DP1 may be electrically connected to the data lines DL located in the display area DA, and the second pads DP2 may be electrically connected to the connection wirings MBL located in the non-display area NDA. The first pads DP1 may be located to correspond to the data lines DL. However, a distance between the first pads DP1 may be different from a distance between the data lines DL. Similarly, the second pads DP2 may be located to correspond to the connection wirings MBL. A distance between the second pads DP2 may be different from a distance between the connection wirings MBL.

In the drawing, a portion of the power connection wiring VPL is located between the first pads DP1 and the second pads DP2, but the arrangement relationship between them is not limited thereto. The arrangement relationship between the first and second pads DP1 and DP2 and the power connection wiring VPL may also be designed differently from that illustrated in the drawing. The flexible films 210 (see FIG. 2) may be located on (e.g., above) the pads DP1 and DP2, and the pads DP1 and DP2 may be electrically connected to the display drivers 220 and the circuit board 230.

The pads DP1 and DP2 and the wirings DL, MBL, and VPL may be arranged symmetrically to each other with respect to a virtual line that crosses the center of the display device 10 in the first direction DR1. The pads DP1 and DP2 and the wirings DL, MBL, and VPL located on both sides of the virtual line in the second direction DR2 may be symmetrical to each other. The wirings located on the left and right sides of the center of the display device 10 may be located in the same order from the center to both sides in the second direction DR2. A wiring located on the left side of the display device 10 to be adjacent to the center, and a wiring located on the right side of the display device 10 to be adjacent to the center, may be the same, and the wirings located on the left side of the display device 10 may be the same as the wirings located on the right side of the display device 10. However, the disclosure is not limited thereto.

Figure 11:
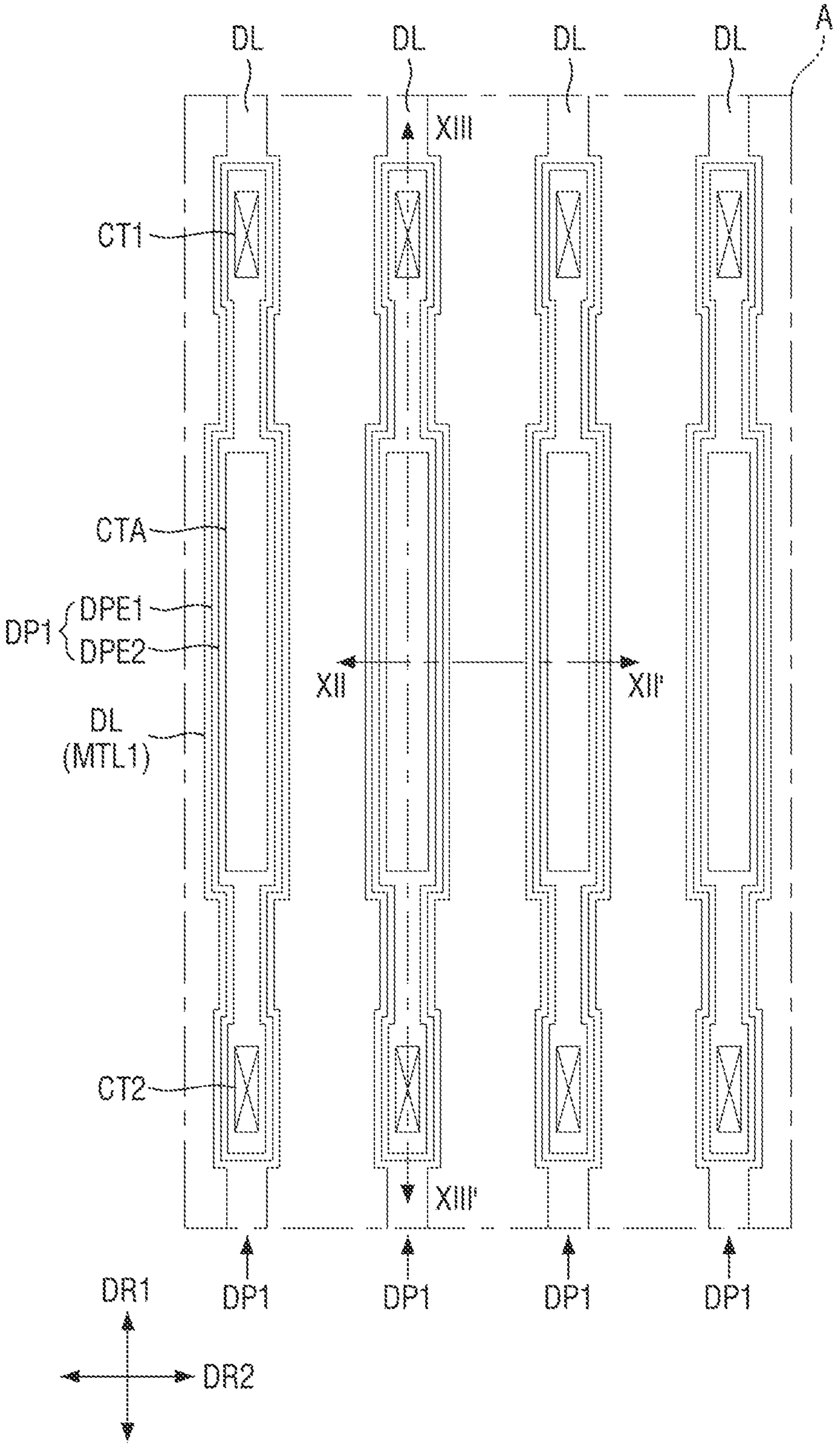
FIG. 11 is an enlarged view of part A of FIG. 10.
Figure 12:
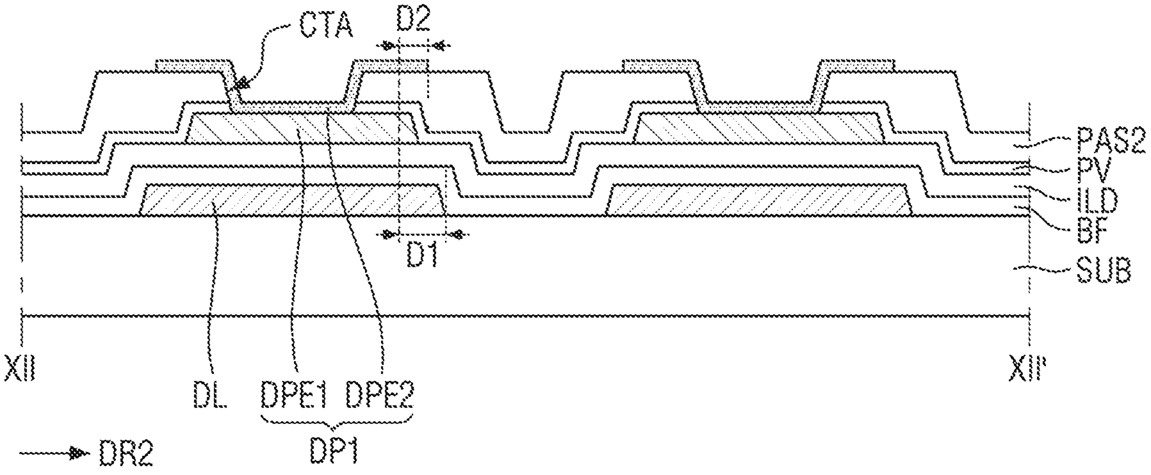
FIG. 12 is a cross-sectional view taken along the line XII-XII' of FIG. 11.
Figure 13:
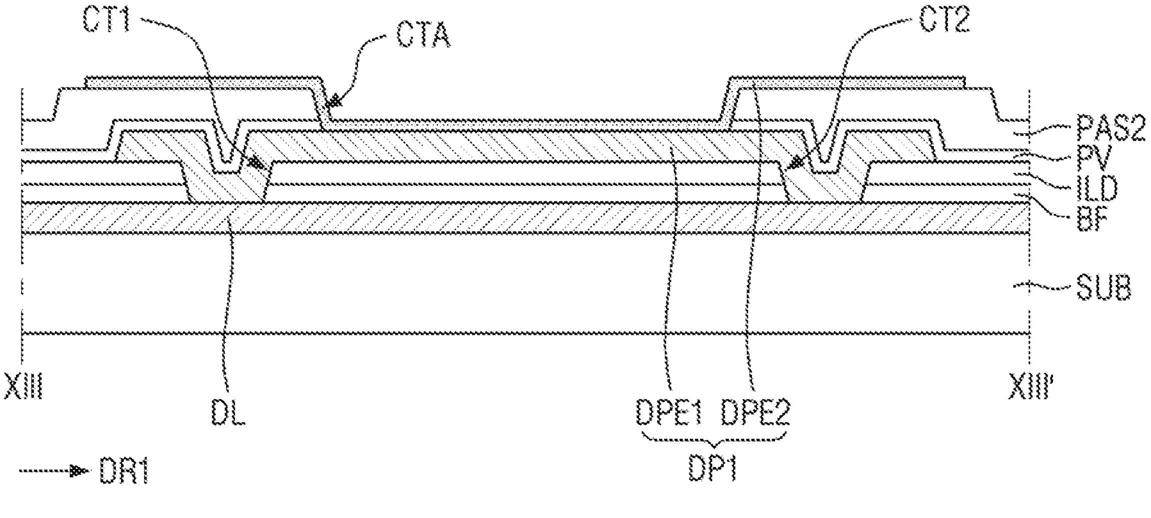
FIG. 13 is a cross-sectional view taken along the line XIII-XIII' of FIG. 11.

FIG. 11 is an enlarged view of part A of FIG. 10. FIG. 12 is a cross-sectional view taken along the line XII-XII' of FIG. 11. FIG. 13 is a cross-sectional view taken along the line XIII-XIII' of FIG. 11.

FIG. 11 is an enlarged plan view illustrating the first pads DP1 among the pads DP1 and DP2. FIG. 12 illustrates a cross section of two adjacent first pads DP1 taken in the second direction DR2 in FIG. 11. FIG. 13 illustrates a cross section of a first pad DP1 taken in the first direction DR1 in FIG. 11.

Referring to FIGS. 11 through 13, each of the pads DP1 and DP2 of the display device 10 according to one or more embodiments may include a pad base layer DPE1, and a pad upper layer DPE2 located on the pad base layer DPE1. The pad base layer DPE1 and the pad upper layer DPE2 may be located on (e.g., above) a data line DL in the pad area PDA to overlap each other. The pad base layer DPE1 and the pad upper layer DPE2 may extend in the first direction DR1, and the overall shape of each first pad DP1 may be a shape extending in the first direction DR1.

A plurality of layers located between the data lines DL, the pad base layers DPE1, and the pad upper layers DPE2 may be located in the pad area PDA, in addition to the data lines DL, the pad base layers DPE1, and the pad upper layers DPE2. The buffer layer BF located on the data lines DL, the interlayer insulating layer ILD located on the buffer layer BF, the passivation layer PV located on the interlayer insulating layer ILD, and the second insulating layer PAS2 located on the passivation layer PV may be located in the pad area PDA. The gate-insulating layer GI, the via layer VIA, and the first insulating layer PAS1 are not located in the pad area PDA, unlike in the display area DA. Therefore, a step may be formed between the display area DA and the pad area PDA.

The data lines DL may be at a same layer as the first metal layer MTL1 located in the display area DA. The data lines DL may be located on (e.g., above) the substrate SUB, and may be at a same layer as, and may include a same material as, other wirings or lines of the first metal layer MTL1. The pad base layers DPE1 may be at a same layer as the third metal layer MTL3 located in the display area DA. The pad base layers DPE1 may be located on (e.g., above) the interlayer insulating layer ILD. The pad upper layers DPE2 may be at a same layer as the fifth metal layer MTL5 located in the display area DA. The pad upper layers DPE2 may be located on (e.g., above) the second insulating layer PAS2. The pad base layers DPE1 may be at a same layer as, and may include a same material as, voltage lines located in the display area DA. The pad upper layers DPE2 may be at a same layer as, and may include a same material as, the contact electrodes CTE located in the display area DA. Although the structure of the first pads DP1 is illustrated in FIGS. 11 through 13, the structure of the second pads DP2 may also be substantially the same as the structure of the first pads DP1.

According to one or more embodiments, in each of the pads DP1 and DP2 of the display device 10, the pad base layer DPE1 may be electrically connected to wirings of the first metal layer MTL1, and the pad upper layer DPE2 may be electrically connected to the pad base layer DPE1. The pad base layer DPE1 may be electrically connected to the first metal layer MTL1 through a first contact hole CT1 and a second contact hole CT2 penetrating the buffer layer BF and the interlayer insulating layer ILD. The pad upper layer DPE2 may be electrically connected to the pad base layer DPE1 through a pad contact hole CTA penetrating the passivation layer PV and the second insulating layer PAS2.

As described above, the flexible films 210 may be located on (e.g., above) the pads DP1 and DP2, and conductive balls may be located between the flexible films 210 and the pads DP1 and DP2 to electrically connect them. The conductive balls may be located on the pad upper layers DPE2 of the pads DP1 and DP2, and each of the pad upper layers DPE2 may have a step difference according to position due to layers located thereunder. A portion of each pad upper layer DPE2, which is located on the second insulating layer PAS2, may be located higher than a portion contacting the pad base layer DPE1 through the pad contact hole CTA. As the step difference according to position on the pad upper layers DPE2 increases, the connection between the conductive balls and the pads DP1 and DP2 may not be smooth. The display device according to one or more embodiments may have a structure that can reduce or minimize a step difference in an area where the pads DP1 and DP2 of the pad area PDA are located, and may reduce poor connection of the flexible films 210 on the pads DP1 and DP2 due to the step difference.

Each of the first pads DP1 may contact a data line DL thereunder in the first contact hole CT1 and the second contact hole CT2 located on respective sides of the pad contact hole CTA in the first direction DR1. The data line DL of the first metal layer MTL1, which is electrically connected to each of the first pads DP1, may extend in the first direction DR1 to overlap all of the first contact hole CT1, the second contact hole CT2, and the pad contact hole CTA, and may reduce or minimize a step difference between a portion where the first contact hole CT1 or the second contact hole CT2 is formed in the first pad DP1, and a portion where the pad contact hole CTA is formed. Because the data line DL of the first metal layer MTL1 also overlaps the pad contact hole CTA, the step difference can be reduced throughout the first pad DP1, and the first metal layer MTL1 and the third metal layer MTL3 may overlap each other throughout the first pad DP1.

In addition, according to one or more embodiments, the data lines DL of the first metal layer MTL1 and the pad upper layers DPE2 may have a greater width than the pad base layers DPE1 of the pads DP1 and DP2. Because the data lines DL have a greater width (e.g., D1*2) than the pad base layers DPE1, it is possible to reduce or prevent the likelihood of the pad base layers DPE1 having a step difference in a width direction. The pad upper layers DPE2 may have a greater width (e.g., D2*2) than the pad base layers DPE1 in consideration of a tolerance that occurs in a process of forming the pad upper layers DPE2. In some embodiments, the data lines DL may have a greater width than the pad upper layers DPE2, and a step difference of the pad upper layers DPE2 in the width direction may also be reduced by the data lines DL. A distance between adjacent data lines DL of the first metal layer MTL1 in the second direction DR2 in the pad area PDA may be less than a distance between adjacent pad base layers DPE1 of the first pads DP1 in the second direction DR2. In addition, a sufficient space for the first pads DP1 to be formed on the data lines DL can be secured.

In the pad area PDA, the first pads DP1 may extend in the first direction DR1, and the data lines DL may also extend in the first direction DR1 and overlap the first pads DP1. A difference in width between the data lines DL and the pad base layers DPE1 and the pad upper layers DPE2 of the first pads DP1 may be maintained substantially constant. As will be described later, the first pads DP1 may have a different width according to position, and the pad base layers DPE1, the pad upper layers DPE2, and the data lines DL may have a different width according to position while maintaining a constant difference in width between them. This will be described in more detail later with reference to other drawings.

In the display device 10, a large number of pads DP1 and DP2 are densely located in the pad area PDA. Therefore, if the flexible films 210 are attached onto the pads DP1 and DP2, precise alignment between the pads DP1 and DP2 and the flexible films 210 may be required. In the display device 10 according to one or more embodiments, line widths of the pads DP1 and DP2 and the wirings of the first metal layer MTL1 located in the pad area PDA may be adjusted so that the pads DP1 and DP2 and the wirings of the first metal layer MTL1 are utilized as alignment marks in the process of attaching the pads DP1 and DP2 and the flexible film 210 to each other.

Figure 14:
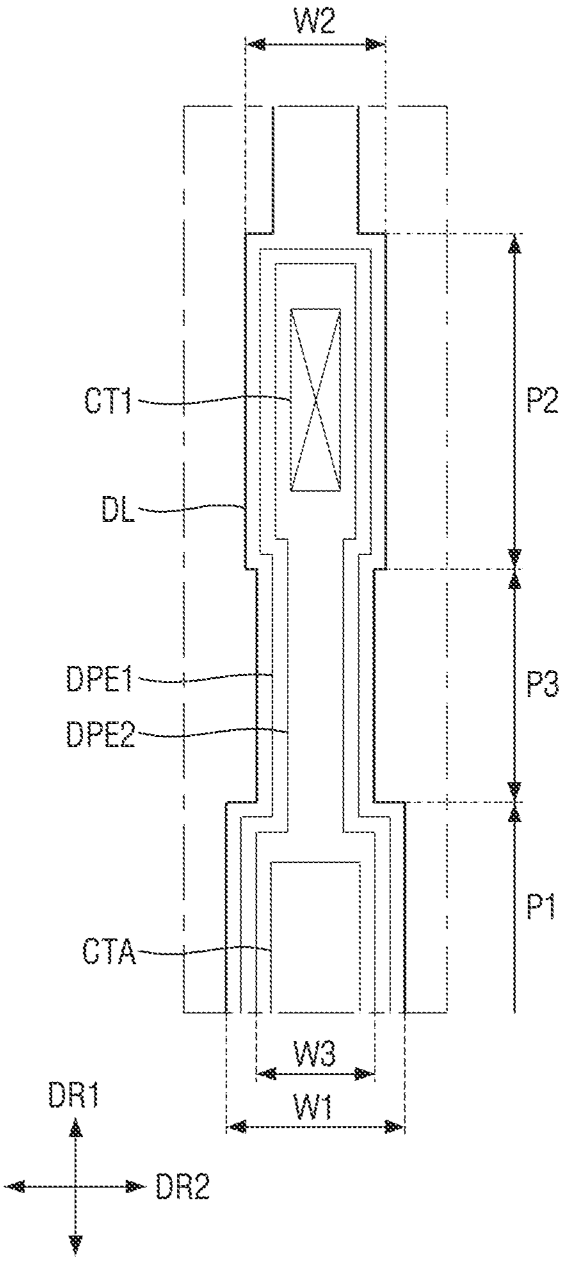
FIG. 14 is an enlarged view of a portion of a pad unit of the display device according to one or more embodiments.

FIG. 14 is an enlarged view of a portion of a pad unit of the display device 10 according to one or more embodiments.

Referring to FIG. 14, in the display device 10 according to one or more embodiments, each of the pads DP1 and DP2 may include a first portion P1 in which a pad contact hole CTA is formed, a second portion P2 in which a contact hole CT1 or CT2 is formed, and a third portion P3 between the first portion P1 and the second portion P2. The first portion P1, the second portion P2, and the third portion P3 of each of the pads DP1 and DP2 may have different respective widths measured in the second direction DR2, and the second portion P2 and the third portion P3, whose widths may vary based on the first portion P1, may serve as alignment marks.

A width W1 of a data line DL overlapping the first portion P1 of each of the pads DP1 and DP2 may be greater than widths W2 and W3 of the data line DL overlapping the second portion P2 and the third portion P3. The width W2 of the data line DL overlapping the second portion P2 of each of the pads DP1 and DP2 may be greater than the width W3 of the data line DL overlapping the third portion P3. In each of the pads DP1 and DP2, the third portion P3 that is narrower than the first portion P1 may be located above and below the first portion P1 in which the pad contact hole CTA is formed, and the second portion P2 that is wider than the third portion P3 may be located above and below the third portion P3. Like the pads DP1 and DP2, the wirings of the first metal layer MTL1, which overlap the pads DP1 and DP2, may also include portions whose line widths vary according to position. Although each of the pads DP1 and DP2 has a different width according to position, a difference in width between the data line DL, a pad base layer DPE1, and a pad upper layer DPE2 may be maintained substantially constant in the first portion P1, the second portion P2, and the third portion P3.

In the process of attaching the flexible films 210 onto the pads DP1 and DP2, positions of the second portions P2 and the third portions P3 having different widths from the first portions P1 may be sensed to accurately align the first portions P1 or conductive balls with the flexible films 210. Accordingly, this can reduce defects occurring in the process of attaching the flexible films 200 during the manufacturing process of the display device 10.

The connection structure between the first pads DP1 located in the pad area PDA and the data lines DL of the first metal layer MTL1 has been described above. The connection structure between other pads (e.g., the second pads DP2 located in the pad area PDA and the connection wirings MBL) may be the same as that described above with reference to FIGS. 11 through 14. However, in some embodiments, each of the connection wirings MBL may be composed of one or more layers, and may have a partially different overlap structure between wirings in a portion located in the pad area PDA, and a portion extending from the above portion and located in the non-display area NDA. The arrangement and connection structure of the second pads DP2 and the connection wirings MBL will now be described.

Figure 15:
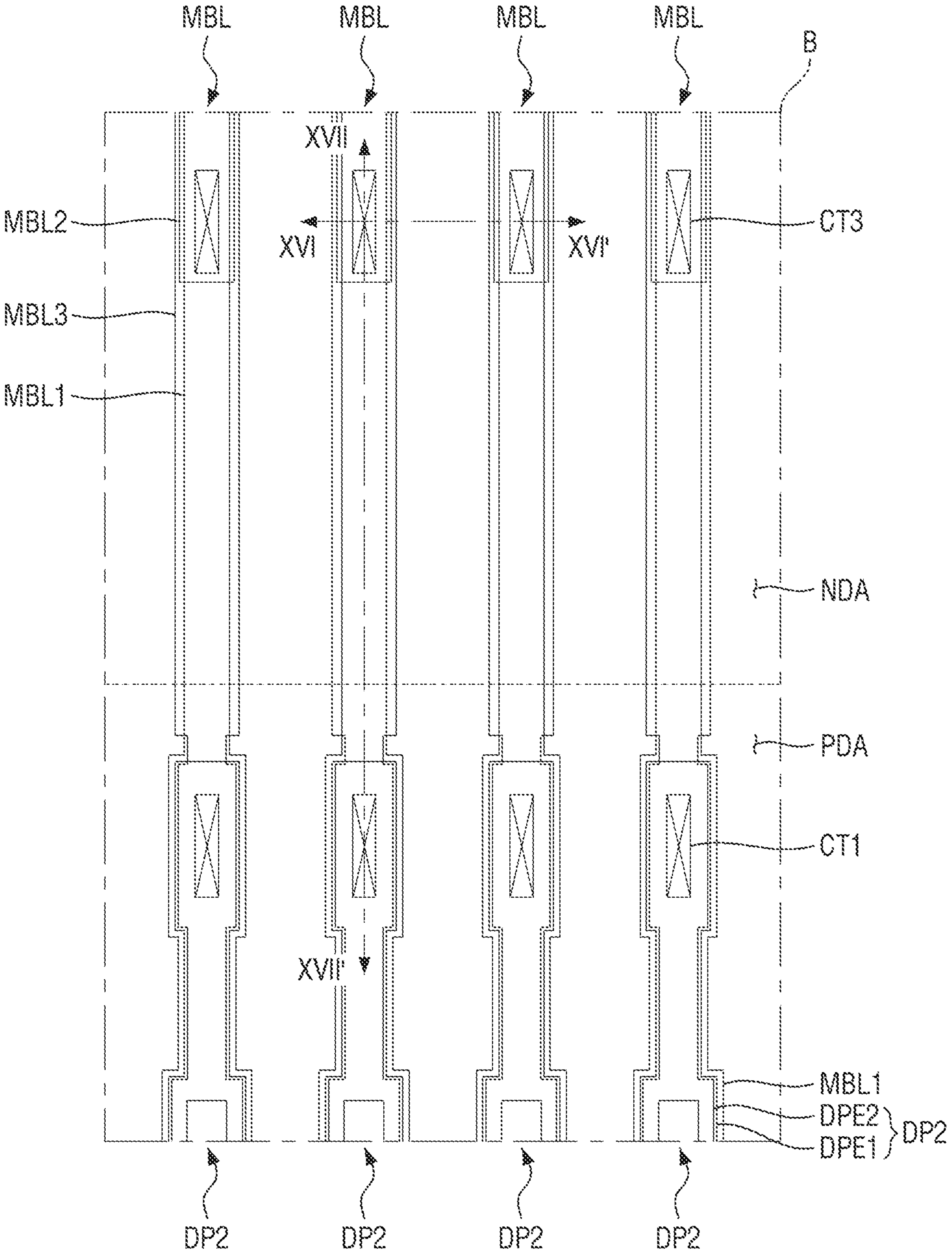
FIG. 15 is an enlarged view of part B of FIG. 10.
Figure 16:
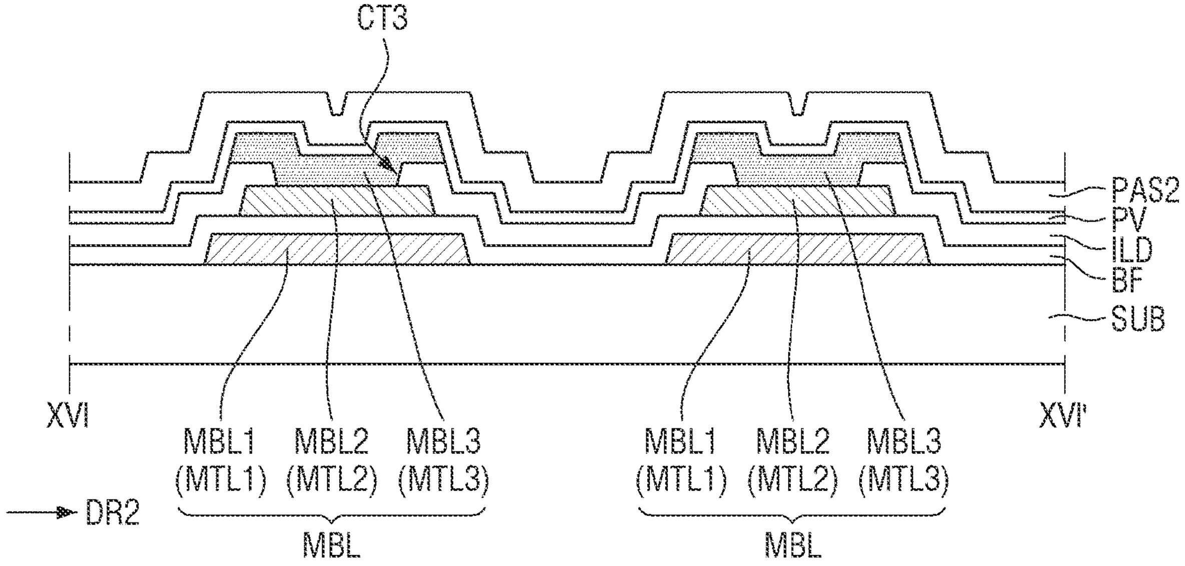
FIG. 16 is a cross-sectional view taken along the line XVI-XVI' of FIG. 15.
Figure 17:
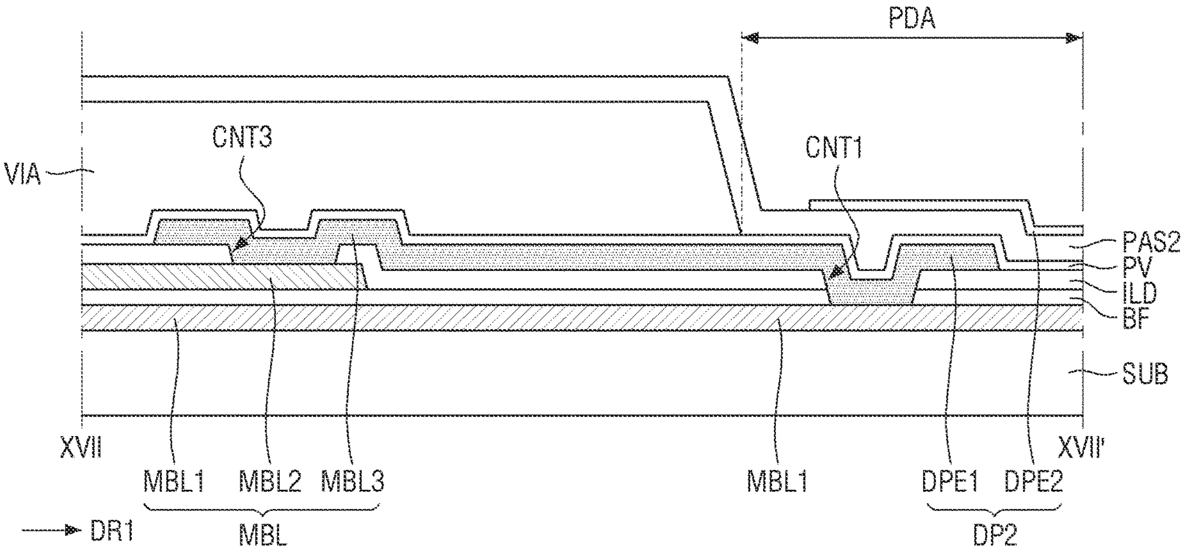
FIG. 17 is a cross-sectional view taken along the line XVII-XVII' of FIG. 15.

FIG. 15 is an enlarged view of part B of FIG. 10. FIG. 16 is a cross-sectional view taken along the line XVI-XVI' of FIG. 15. FIG. 17 is a cross-sectional view taken along the line XVII-XVII' of FIG. 15.

FIG. 15 is an enlarged plan view illustrating the second pads DP2 among the pads DP1 and DP2 and the connection wirings MBL. FIG. 16 illustrates a cross section of two adjacent connection wirings MBL taken in the second direction DR2 in FIG. 15. FIG. 17 illustrates a cross section of a second pad DP2 and a connection wiring MBL taken in the first direction DR1 in FIG. 15.

Referring to FIGS. 15 through 17, in the display device 10 according to one or more embodiments, each of the connection wirings MBL may include a plurality of connection wirings MBL1, MBL2, and MBL3 located in different metal layers MTL1 through MTL3. The connection wirings MBL1, MBL2, and MBL3 may include a first connection wiring MBL1 located in the first metal layer MTL1, a second connection wiring MBL2 located in the second metal layer MTL2, and a third connection wiring MBL3 located in the third metal layer MTL3. The first connection wiring MBL1, the second connection wiring MBL2, and the third connection wiring MBL3 may extend to overlap each other in the non-display area NDA, and may be located on both sides of the display area DA in the second direction DR2. Among them, the first connection wiring MBL1 and the third connection wiring MBL3 may extend from the pad area PDA to the non-display area NDA, and the second connection wiring MBL2 may be located only in the non-display area NDA. The second connection wiring MBL2 may not overlap a second pad DP2.

The first connection wirings MBL1, like the data lines DL, may extend from the pad area PDA, and may overlap the second pads DP2 in the pad area PDA. In one or more embodiments, the arrangement relationship between the first pads DP1 and the data lines DL illustrated in FIGS. 11 through 13 may be the same as the arrangement relationship between the second pads DP2 and the first connection wirings MBL1. In the pad area PDA, the pad base layers DPE1 of the second pads DP2 may contact the first connection wirings MBL1 of the first metal layer MTL1 through contact holes CT1 and CT2. The first connection wirings MBL1 may also overlap pad contact holes CTA in which the pad upper layers DPE2 and the pad base layers DPE1 of the second pads DP2 contact each other, and may reduce a step difference according to position on the second pads DP2. In addition, line widths of the first connection wirings MBL1 may be greater than those of the pad base layers DPE1 and the pad upper layers DPE2 of the second pads DP2. This is substantially the same as the description of FIGS. 11 through 13.

The third connection wirings MBL3 may be located in the third metal layer MTL3, and may be connected to the pad base layers DPE1 of the second pads DP2. The third connection wirings MBL3 may be integrated with the pad base layers DPE1, and may extend from the pad area PDA to the non-display area NDA. In a portion of each second pad DP2 where a first contact hole CT1 or a second contact hole CT2 is formed, the first connection wiring MBL1 and the pad base layer DPE1 or the third connection wiring MBL3 may overlap each other.

The second connection wirings MBL2 may overlap the first connection wirings MBL1 and the third connection wirings MBL3 in the non-display area NDA. The second connection wirings MBL2 may be at a same layer as, and may include the same material as, the second metal layer MTL2 of the display area DA. The second connection wirings MBL2 may be located on (e.g., above) the buffer layer BF, and may be located between the first connection wirings MBL1 and the third connection wirings MBL3. The third connection wirings MBL3 may be electrically connected to the second connection wirings MBL2 through third contact holes CT3 penetrating the interlayer insulating layer ILD in the non-display area NDA.

In the display device 10, the first connection wirings MBL1 of the first metal layer MTL1 and the third connection wirings MBL3 of the third metal layer MTL3 overlap each other in the first contact holes CT1 or the second contact holes CT2 of the pad area PDA. On the other hand, the first, second, and third connection wirings MBL1, MBL2, and MBL3 of the first, second, and third metal layers MTL1, MTL2, and MTL3 may overlap each other in the third contact holes CT3 of the non-display area NDA. Because each of the connection wirings MBL is composed of a plurality of wirings located in different metal layers, it may be located around the display area DA to reduce a voltage drop due to an increase in resistance as the distance from the pad area PDA increases.

The via layer VIA may not be located in the pad area PDA, but may be located in the non-display area NDA located inside the pad area PDA. The second insulating layer PAS2 may be located on (e.g., above) the via layer VIA. The first contact holes CT1 in which the second pads DP2 and the first connection wirings MBL1 contact each other may not overlap the via layer VIA, and the third contact holes CT3 in which the third connection wirings MBL3 contact the second connection wirings MBL2 may overlap the via layer VIA.

In the display device 10 according to one or more embodiments, the wirings located in the pad area PDA may completely overlap the pads DP1 and DP2, and a step difference of the pads DP1 and DP2 caused by wirings located under the pads DP1 and DP2 can be reduced or minimized. In addition, in the display device 10, each of the connection wirings MBL located in the pad area PDA and the non-display area NDA may be composed of a plurality of layers, and wirings located on different layers in the pad area PDA and the non-display area NDA may overlap each other.

Other embodiments of the display device 10 will now be described with reference to other drawings.

Figure 18:
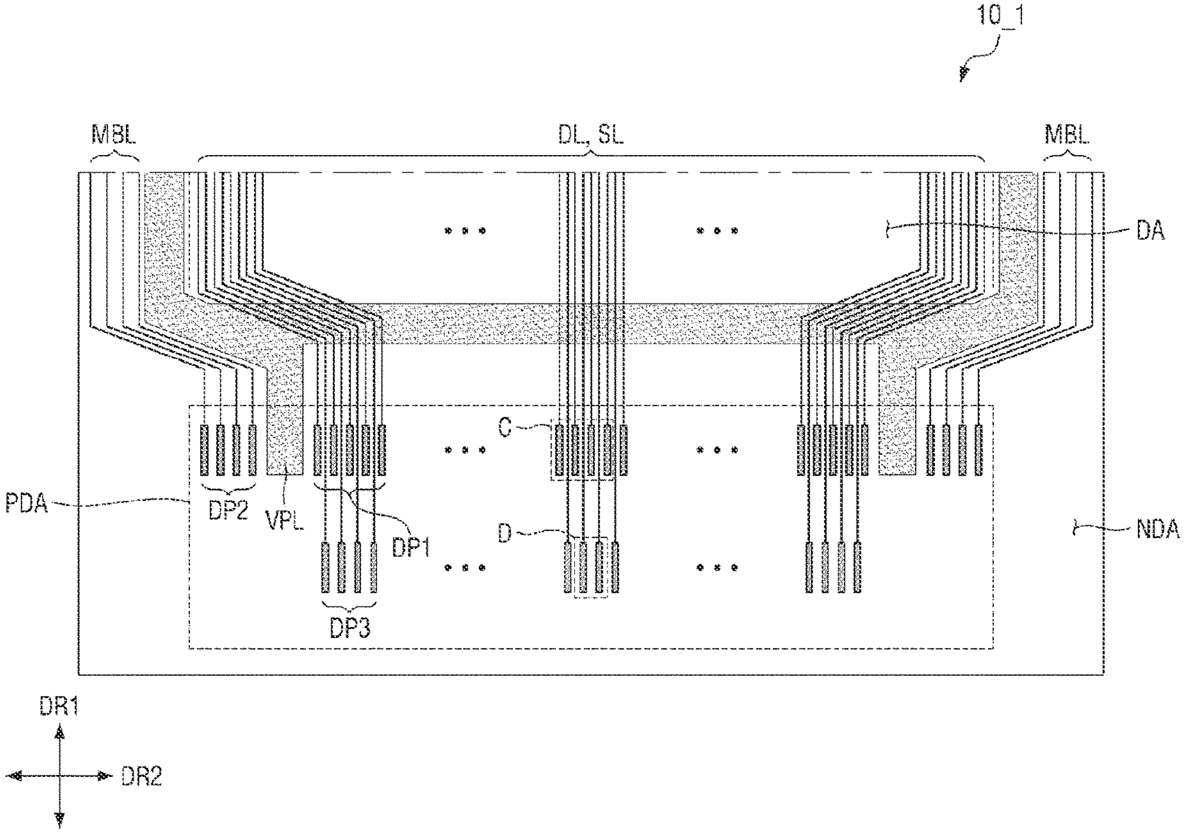
FIG. 18 is a plan view illustrating a pad area and wirings located around the pad area of a display device according to one or more embodiments.

FIG. 18 is a plan view illustrating a pad area PDA, and wirings located around the pad area PDA, of a display device 10_1 according to one or more embodiments.

Referring to FIG. 18, the display device 10_1 according to one or more embodiments may further include a plurality of third pads DP3 located in the pad area PDA, and the third pads DP3 may be electrically connected to a plurality of scan lines SL located in a display area DA. Unlike in the display device 10 of FIG. 2, in the display device 10_1, some of gate drivers 260 located on one or both sides of the display area DA in the second direction DR2 may be located on a circuit board 230 connected through flexible films 210. Accordingly, the third pads DP3 electrically connected to the scan lines SL may be further located in the pad area PDA.

The third pads DP3 may have substantially the same structure as first pads DP1, but may not be located side by side with the first pads DP1 in the second direction DR2. In the pad area PDA, the first pads DP1 and second pads DP2 may be located in a first pad row, and the third pads DP3 may be located in a second pad row located below the first pad row in the first direction DR1. The first pads DP1 and the second pads DP2 may be spaced apart from each other in the second direction DR2 in the first pad row, and the third pads DP3 may be spaced apart from each other in the second direction DR2 in the second pad row.

The scan lines SL may extend from the display area DA to the pad area PDA in the first direction DR1, and may be electrically connected to the third pads DP3, respectively. The scan lines SL and data lines DL may be alternately located in the second direction DR2, and each of the scan lines SL may extend in the first direction DR1 in a space between the first pads DP1 in the pad area PDA. Accordingly, while the data lines DL and the scan lines SL are alternately located in the second direction DR2 and extend parallel to each other in the display area DA, the first pads DP1 connected to the data lines DL and the third pads DP3 connected to the scan lines SL may not be located side by side in the pad area PDA.

Figure 19:
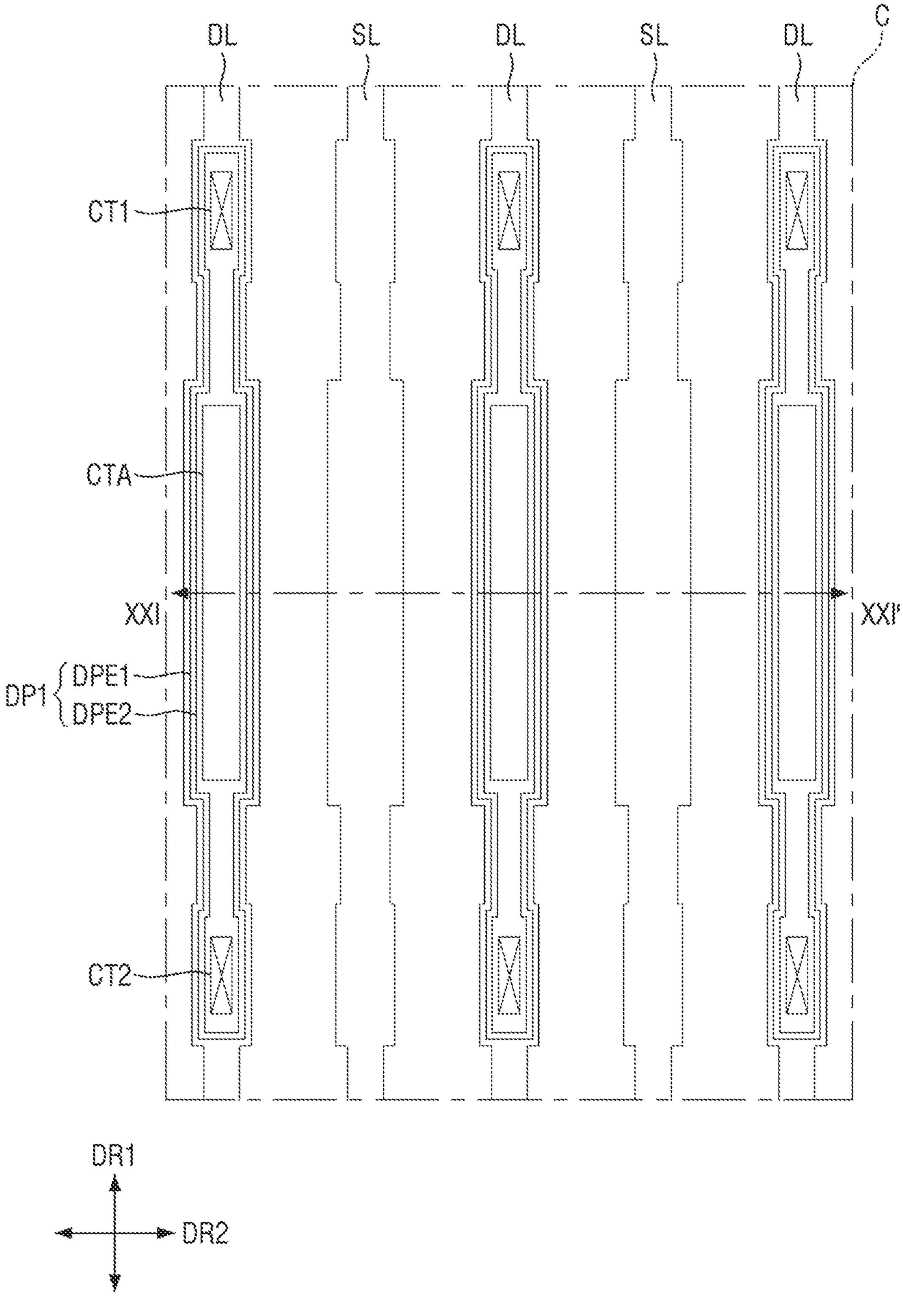
FIG. 19 is an enlarged view of part C of FIG. 18.
Figure 20:
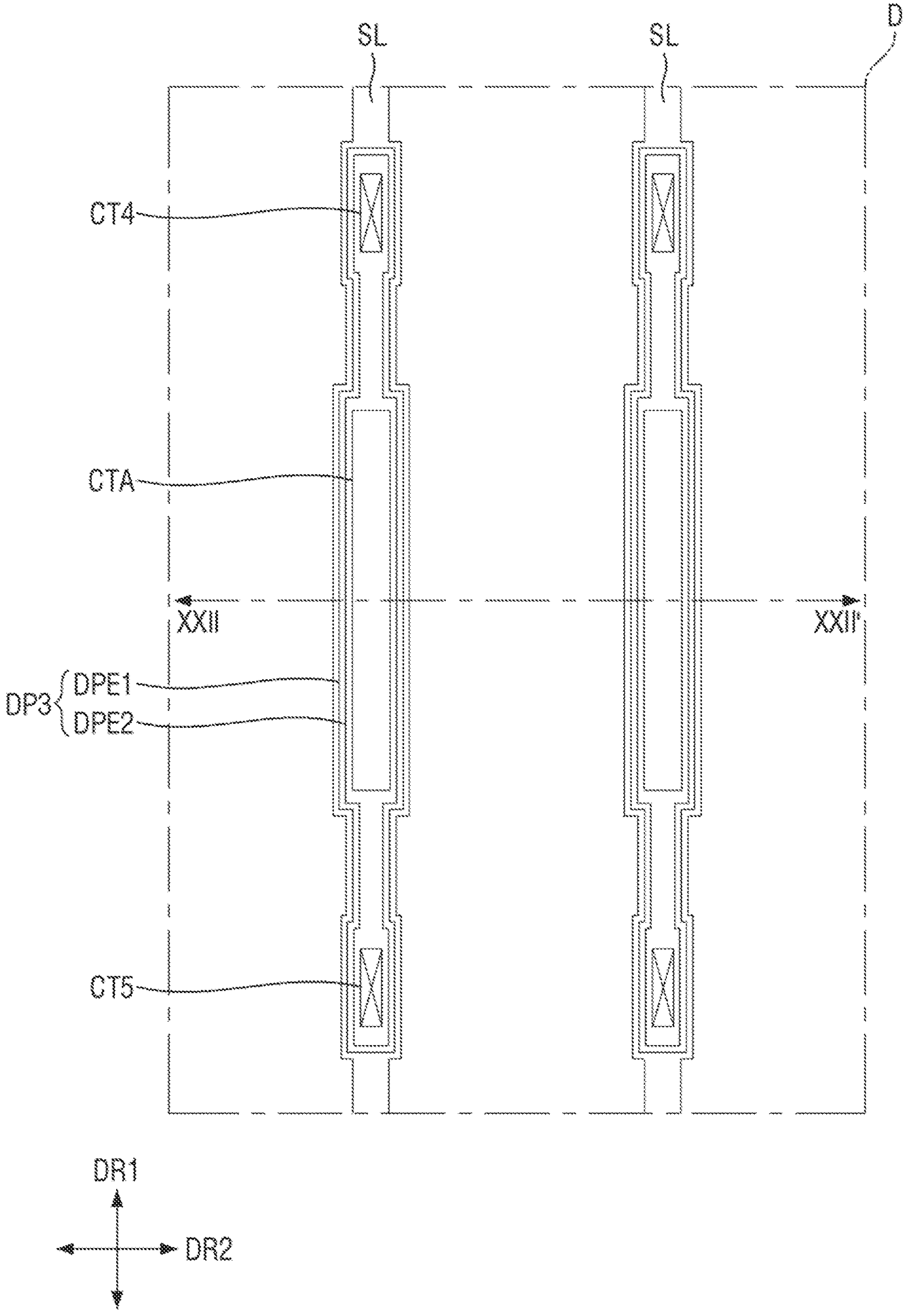
FIG. 20 is an enlarged view of part D of FIG. 18.
Figure 21:
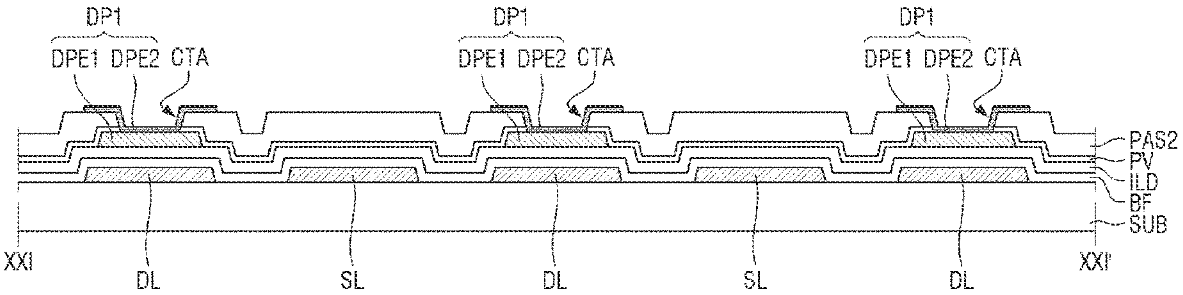
FIG. 21 is a cross-sectional view taken along the line XXI-XXI' of FIG. 19.
Figure 22:
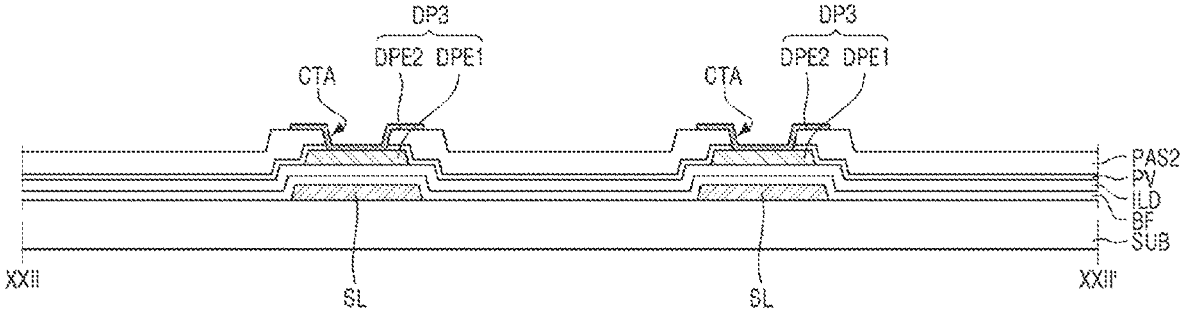
FIG. 22 is a cross-sectional view taken along the line XXII-XXII' of FIG. 20.

FIG. 19 is an enlarged view of part C of FIG. 18. FIG. 20 is an enlarged view of part D of FIG. 18. FIG. 21 is a cross-sectional view taken along the line XXI-XXI' of FIG. 19. FIG. 22 is a cross-sectional view taken along the line XXII-XXII' of FIG. 20.

FIG. 19 is an enlarged view of an area where a plurality of first pads DP1 and a plurality of scan lines SL are located. FIG. 20 is an enlarged view of an area where a plurality of third pads DP3 are located. FIG. 21 illustrates a cross section of the first pads DP1 and the scan lines SL taken in the second direction DR2. FIG. 22 illustrates a cross section of the third pads DP3 taken in the second direction DR2.

Referring to FIGS. 19 through 22, the first pads DP1 and the third pads DP3 may each include a pad base layer DPE1 and a pad upper layer DPE2 stacked on each other. Because the cross-sectional structures and planar structures of the first and third pads DP1 and DP3 are substantially the same as those described above with reference to FIGS. 11 through 13, a detailed description thereof will be omitted.

The first pads DP1 may overlap the data lines DL, and the scan lines SL may be located between them. The data lines DL and the scan lines SL may be located in a first metal layer MTL1, and each of the first pads DP1 may include the pad base layer DPE1 and the pad upper layer DPE2 located in a third metal layer MTL3 and a fifth metal layer MTL5. In the pad area PDA, a distance between different wirings located in the first metal layer MTL1 may be less than a distance between the first pads DP1.

The pad base layer DPE1 of each of the third pads DP3 may contact a scan line SL through a fourth contact hole CT4 and a fifth contact hole CT5. Each of the scan lines SL may overlap not only the fourth contact hole CT4 and the fifth contact hole CT5, but also a pad contact hole CTA located between them, and may completely overlap a third pad DP3. Because a scan line SL is located under each of the third pads DP3, a step difference due to a wiring or a layer under the third pad DP3 can be reduced or minimized.

The scan lines SL may extend in spaces between the first pads DP1 or the data lines DL in the pad area PDA, and may be connected to the third pads DP3 in the second pad row. Although the display device 10_1 has more pads DP1 through DP3 and wirings DL and SL in the pad area PDA than the display device 10 of FIG. 10, a sufficient distance can be secured between the pads DP1 through DP3 because the first pads DP1 and the third pads DP3 are not located side by side in the second direction DR2. Accordingly, in the display device 10_1, a sufficient distance can be secured between the wirings DL and SL overlapping the pads DP1 through DP3, and sufficient widths of the wirings DL and SL can be secured. In addition, the wirings DL and SL may be completely overlapped by the pads DP1 through DP3. Therefore, a step difference that may occur in the pads DP1 through DP3 can be reduced or minimized.

In a display device according to one or more embodiments, wirings electrically connected to pads completely overlap the pads in a pad area. Therefore, a step difference formed by the overlap of the pads and insulating layers can be reduced or minimized.

In addition, in a display device according to one or more embodiments, pads may have a different width according to position, and misalignment can be reduced in a process of aligning members located on the pads with the pads.

In the display device, the above connection structure may be formed in a display area to reduce or prevent a voltage drop of a potential applied to a common electrode.

In concluding the detailed description, those skilled in the art will appreciate that many variations and modifications can be made to the disclosed embodiments without substantially departing from the aspects of the present disclosure. Therefore, the disclosed embodiments are used in a generic and descriptive sense only and not for purposes of limitation.

What is claimed is:

1. A display device comprising:

a display area in which pixels are located, a non-display area surrounding the display area in plan view, and a pad area in the non-display area on a side of the display area in a first direction;

a first electrode and a second electrode extending in the first direction in the display area, and spaced apart from each other in a second direction crossing the first direction;

light-emitting elements on the first electrode and the second electrode in the display area;

data lines extending from the pad area to the display area in the first direction;

connection wirings spaced apart from the data lines, and extending from the pad area to the non-display area on respective sides of the display area in the second direction;

first pads overlapping the data lines in the pad area; and second pads spaced apart from the first pads in the second direction in the pad area, and overlapping the connection wirings, wherein the connection wirings comprise:

a first connection wiring overlapping a second pad of the second pads;

a second connection wiring not overlapping the second pad, and overlapping the first connection wiring in the non-display area; and a third connection wiring overlapping the first connection wiring in the pad area, and electrically connected to the second pad, wherein the first connection wiring, the second connection wiring, and the third connection wiring extend in the first direction, and overlap each other in the non-display area.

2. The display device of claim 1, wherein the first pads and the second pads respectively comprise a pad base layer, and a pad upper layer on the pad base layer and contacting the pad base layer through a pad contact hole, and wherein the pad base layer directly contacts a data line of the data lines or the first connection wiring through a first contact hole and a second contact hole that are spaced apart from the pad contact hole in the first direction.

3. The display device of claim 2, wherein the data line overlaps the first contact hole, the pad contact hole, and the second contact hole overlapping a first pad of the first pads in the pad area.

4. The display device of claim 2, wherein the first connection wiring overlaps the first contact hole, the pad contact hole, and the second contact hole overlapping the second pad in the pad area.

5. The display device of claim 4, wherein the third connection wiring is directly connected to the pad upper layer of the second pad in the pad area, and directly contacts the second connection wiring through a third contact hole in a portion overlapping the first connection wiring and the second connection wiring in the non-display area.

6. The display device of claim 2, wherein the first pads and the second pads respectively comprise a first portion overlapping the pad contact hole, a second portion overlapping the first contact hole or the second contact hole, and a third portion between the first portion and the second portion, and wherein the first portion, the second portion and the third portion have different respective widths measured in the second direction.

7. The display device of claim 6, wherein the width of the first portion is greater than the widths of the second portion and the third portion, and wherein the width of the third portion is greater than the width of the second portion.

8. The display device of claim 6, wherein the data line, the pad base layer and the pad upper layer have different widths measured in the second direction, and wherein differences between the widths of the data line, the pad base layer, and the pad upper layer are constant in each of the first portion, the second portion, and the third portion.

9. The display device of claim 2, wherein a width of the data line measured in the second direction is greater than a width of one of the first pads measured in the second direction.

10. The display device of claim 9, wherein a width of the pad base layer measured in the second direction is less than a width of the pad upper layer measured in the second direction.

11. The display device of claim 9, wherein a distance between adjacent ones of the data lines in the pad area is less than a distance between adjacent ones of the first pads.

12. The display device of claim 1, further comprising:

scan lines between the data lines, and extending from the pad area to the display area; and third pads overlapping the scan lines in the pad area, wherein the third pads and the first pads are not side by side in the second direction.

13. The display device of claim 12, wherein a distance between adjacent ones of the first pads in the second direction is greater than a distance between the data lines and the scan lines.

* * * * *